United States Patent
Nam et al.

(10) Patent No.: US 8,669,130 B2
(45) Date of Patent: Mar. 11, 2014

(54) FRINGE FIELD SWITCHING LIQUID CRYSTAL DISPLAY DEVICE AND METHOD OF FABRICATING THE SAME

(71) Applicant: LG Display Co., Ltd., Seoul (KR)

(72) Inventors: KyoungJin Nam, Paju-Si (KR); SeungRyull Park, Goyang-Si (KR); KyungMo Son, Paju-Si (KR); JiHye Lee, Paju-Si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/668,071

(22) Filed: Nov. 2, 2012

(65) Prior Publication Data

US 2013/0112979 A1      May 9, 2013

(30) Foreign Application Priority Data

Nov. 3, 2011   (KR) .......................... 10-2011-0114159

(51) Int. Cl.
    *H01L 21/00*      (2006.01)

(52) U.S. Cl.
    USPC ...... 438/48; 438/149; 438/151; 257/E21.617; 257/E21.053

(58) Field of Classification Search
    USPC ........................... 438/48, 128, 149, 151, 157; 257/E21.617, E21.053
    See application file for complete search history.

(56) References Cited

U.S. PATENT DOCUMENTS

2008/0191213 A1*   8/2008   Bae et al. .................... 257/66

* cited by examiner

*Primary Examiner* — Hoai V Pham
(74) *Attorney, Agent, or Firm* — Fenwick & West LLP

(57) ABSTRACT

A fringe field switching (FFS) liquid crystal display (LCD) device which uses an organic insulating layer and consumes less power, in which film quality of an upper layer of a low temperature protective film is changed to improve undercut within a pad portion contact hole, and a method for fabricating the same is provided.

14 Claims, 32 Drawing Sheets

FRINGE FIELD SWITCHING LIQUID CRYSTAL DISPLAY DEVICE AND METHOD OF FABRICATING THE SAME

CROSS-REFERENCE TO RELATED APPLICATIONS

The present disclosure relates to subject matter contained in priority Korean Application No. 10-2011-0114159, filed on Nov. 3, 2011, which is incorporated by reference herein in its entirety.

BACKGROUND

1. Field of the Invention

The present invention relates to a method for fabricating a fringe field switching (FFS) liquid crystal display (LCD) device and, more particularly, to a FFS LCD device which uses an organic insulating layer and consumes less power, and a method for fabricating the same.

2. Description of the Related Art

As the interest in information displays grows and demand for portable (mobile) information medium increases, research and commercialization of lighter and thinner flat panel displays ("FPD") replacing conventional display devices such ascathode ray tubes (CRTs) have been actively ongoing. Among FPDs, the liquid crystal display ("LCD") is a device for displaying images by using optical anisotropy of liquid crystal. LCD devices exhibit excellent resolution, color display and picture quality, so they are commonly used in notebook computers or desktop monitors, and the like.

The LCD includes a color filter substrate, an array substrate and a liquid crystal layer formed between the color filter substrate and the array substrate.

Here, a driving scheme generally used in the LCD includes a twisted nematic (TN) scheme in which liquid crystal molecules are driven in a direction perpendicular to a substrate, but the twisted nematic LCD device has shortcomings in that a viewing angle is as narrow as 90 degrees. This results from refractive anisotropy of liquid crystal molecules. Namely, when a voltage is applied to a panel, liquid crystal molecules, which are aligned to be horizontal to a substrate, is changed to be aligned to be substantially vertical to the substrate.

Thus, an in-plane switching (IPS) mode LCD device in which a viewing angle is improved to have 170 degrees or more by driving liquid crystal molecules in a direction horizontal to a substrate has been presented. An IPS mode LCD device will be described in detail as follows.

FIG. 1 is a schematic cross-sectional view illustrating a portion of an array substrate of an IPS mode LCD device. Specifically, FIG. 1 illustrates a portion of an array substrate of a fringe field switching (FFS) LCD device in which a fringe field formed between a pixel electrode and a common electrode drives liquid crystal molecules positioned on a pixel region and a common electrode through a slit to display an image.

In the FFS LCD device, in a state in which liquid crystal molecules are aligned horizontally, as a common electrode is formed in a lower side thereof and a pixel electrode is formed in an upper side thereof, electric fields are generated in horizontal and vertical directions, and thus, liquid crystal molecules are twisted and tilted to be driven.

As illustrated, in the general FFS LCD device, a gate line (not shown) and a data line 17 are arranged vertically and horizontally on a transparent array substrate 10 to define a pixel region, and a thin film transistor (TFT) as a switching element is formed in the intersection of the gate line and the data line.

The TFT includes a gate electrode 21 connected to the gate line, a source electrode 22 connected to the data line 17, and a drain electrode 23 connected to a pixel electrode 18. Also, the TFT includes a gate insulating layer 15a for insulating the gate electrode 21 and the source and drain electrodes 22 and 23, and an active layer 24 for forming a conductive channel between the source electrode 22 and the drain electrode 23 by a gate voltage supplied to the gate electrode 21.

Source and drain regions of the active layer 24 forms ohmic-contact with the source and drain electrodes 22 and 23 through an ohmic-contact layer 25n.

The common electrode 8 and the pixel electrode 18 is formed in the pixel region, and the box-like shaped pixel electrode 18 includes a plurality of slits 18s therein in order to generate a fringe field together with the common electrode 8.

The pixel electrode 18 is electrically connected to the drain electrode 23 through a first contact hole formed in a first protective film 15b, a second protective film 15c, and a third protective film 15d.

Meanwhile, a gate pad electrode 26p electrically connected to the gate line and the data line 17, respectively, is formed on the edge region of the array substrate 10 and delivers a scan signal and a data signal received from an external driving circuit unit (not shown) to the gate line and the data line 17.

Namely, the gate line and the data line 17 extend toward the driving circuit unit so as to be connected to the corresponding gate pad line 16p and the data pad line 17p, and the gate pad line 16p and the data pad line 17p receive a scan signal and a data signal from the driving circuit unit through the gate pad electrode 26p and the data pad electrode 27p electrically connected thereto, respectively.

The data pad line 17p is electrically connected to the data pad electrode 27p through a second contact hole, and the gate pad line 16p is electrically connected to the gate pad electrode 26p through a third contact hole.

The FFS LCD device configured as described above advantageously has a wide viewing angle, and in case the common electrode 8 is formed up to an upper portion of the data line 17, a black matrix region can be reduced to enhance an aperture ratio.

However, in case of forming an organic insulating layer with photo acryl to implement low power consumption, the upper third protective film 15d should be formed at a processing temperature lower than that of a previous process, namely, a photo acryl curing process. In this case, when a pad portion contact hole is formed, a problem that an undercut is formed within the pad portion contact hole arises. This will be described in detail with reference to the accompanying drawings.

FIG. 2 is a cross-sectional view schematically showing a portion of a pad portion of the general FFS LCD device illustrated in FIG. 1, in which a section of a gate pad portion in the course of forming a contact hole is illustrated.

Referring to FIG. 2, when the third protective film 15d is deposited at a low temperature, a bonding ratio of Si—N is so low as to have porous quality, and in this case, when the gate electrode layer 15a, the first protective film 15b, and the third protective film 15d are collectively dry-etched, the gate electrode layer 15a, the first protective film 15b, and the third protective film 15d are not uniformly etched due to a discontinuous deposition surface therebetween, generating an undercut within the pad portion contact hole H.

Thus, an interface between the gate insulating layer 15a and the first and third protective films 15b and 15d is reversely tapered to result in a defective contact between the gate pad electrode 26p and the gate pad line 16p, causing disconnection.

For reference, reference letters PR denote a photoresist pattern for forming the pad portion contact hole H.

SUMMARY OF THE INVENTION

An aspect of the present invention provides a fringe field switching (FFS) liquid crystal display (LCD) device which uses an organic insulating layer and consumes less power. The film quality of an upper layer of a low temperature protective film is changed to improve undercut within a pad portion contact hole. The present invention also provides a method for fabricating the same.

According to an aspect of the present invention, there is provided a method for fabricating a fringe field switching (FFS) liquid crystal display (LCD) device, including: providing a first substrate divided into a pixel portion and a pad portion; forming a gate electrode and a gate line in the pixel portion of the first substrate and forming a pad line in the pad portion of the first substrate; forming a gate insulating layer on the first substrate with the gate electrode, the gate line, and the pad line formed thereon; forming an active layer in an upper portion of the gate electrode with the gate insulating layer formed thereon; forming a source electrode and a drain electrode in an upper portion of the active layer of the first substrate with the active layer formed thereon, and forming a data line crossing the gate line to define a pixel region; forming a first protective film on the first substrate with the source electrode, the drain electrode, and the data line formed thereon; forming a second protective film formed as an organic insulating layer in the pixel portion of the first substrate with the protective film formed thereon; forming a first electrode in the pixel portion of the first substrate with the second protective film formed thereon; forming a third protective film on the first substrate with the first electrode formed thereon such that an upper layer thereof has more porosity than that of a lower layer thereof by adjusting a gas flow rate; selectively etching the gate insulating layer, the first protective film, and the third protective film to form a pad portion contact hole exposing the pad line; forming a second electrode in the pixel portion of the first substrate with the third protective film formed thereon and forming a pad electrode electrically connected to the pad line through the pad portion contact hole in the pad portion of the first substrate; and attaching the first and second substrates.

The second protective film may be formed as an organic insulating layer such as photoacryl.

The second protective film may be formed as an organic insulating layer including a component such as acrylate, polyimide, or epoxy.

After the second protective film in the pixel portion of the first substrate, the second protective film may be cured through a curing process.

The third protective film may be formed as an inorganic insulating layer such as a silicon nitride film, a silicon oxide film, and may be formed at a process temperature lower than that of the curing process.

The third protective film may be formed by increasing a ratio of $NH_3$ gas to $SiH_4$ gas from 1:3 to 1:4 and reducing a flow rate of $N_2$ gas from 100% to less than 100%.

The upper layer of the third protective film may be formed such that a ratio of Si—H/Si—N bonding is 80% or greater in order to reduce a relative Si—N bond of the upper layer of the third protective film in comparison to a discontinuous deposition surface between the gate insulating layer and the first and third protective films.

The third protective film may be formed such that a thickness of the upper layer thereof to a total thickness is 5% to 20%.

The second electrode as a pixel electrode may be formed to have a box-like shape with a plurality of slits in each pixel region and the first electrode as a common electrode may be formed as a single pattern in the entire pixel portion excluding a contact region between the drain electrode and the pixel electrode.

The first electrode as a pixel electrode may be formed to have a box-like shape in each pixel region, and the second electrode as a common electrode may be formed as a single pattern in the entire pixel portion excluding the contact region between the drain electrode and the pixel electrode.

The pad portion contact hole exposing the pad line may be formed by selectively etching the gate insulating layer, the first protective film, and the third protective film through a 1-step or 2-step dry etching process.

The pad portion may include a data pad portion and a gate pad portion, and the pad line may include a data pad line and a gate pad line.

The pad portion contact hole may include a data pad portion contact hole and a gate pad portion contact hole exposing the data pad line and the gate pad line.

The pad electrode may include a data pad electrode and a gate pad electrode electrically connected to the data pad line and the gate pad line through the data pad portion contact hole and the gate pad portion contact hole, respectively.

According to another aspect of the present invention, there is provided a fringe field switching (FFS) liquid crystal display (LCD) device, including: a first substrate; a gate line and a data line formed on the first substrate and crossing each other to define a pixel region; a thin film transistor (TFT) formed in the crossing of the gate line and the data line and including a gate electrode, an active layer, and source and drain electrodes; an organic protective film formed on the first substrate with the TFT, the gate line, and the data line formed thereon, and formed of an organic insulating layer; a common electrode formed as a single pattern on the entire first substrate with the organic protective film formed thereon; a low temperature protective film formed on the first substrate with the common electrode formed thereon and including an upper layer and a lower layer, the upper layer having more porosity than that of the lower layer; a pixel electrode formed in the pixel region of the first substrate with the low temperature protective film formed thereon and having a box-like shape with a plurality of slits; and a second substrate attached to the first substrate in a facing manner, wherein a ratio of an Si—H/Si—N bonding of the upper layer of the low temperature protective film is 80% or greater.

The organic protective film may be formed as an organic insulating layer such as photoacryl.

The organic protective film may be formed as an organic insulating layer including a component such as acrylate, polyimide, or epoxy.

The low temperature protective film may be formed as an inorganic insulating layer such as a silicon nitride film, a silicon oxide film, and may be formed at a process temperature lower than that of the curing process.

The low temperature protective film may be formed by increasing a ratio of $NH_3$ gas to $SiH_4$ gas from 1:3 to 1:4 and reducing a flow rate of $N_2$ gas from 100% to less than 100%.

The low temperature protective film may be formed such that a thickness of the upper layer thereof to a total thickness is 5% to 20%.

As described above, in the case of the FFS LCD device and the method for fabricating the same according to embodiments of the present invention, an undercut within a pad portion contact hole can be improved by increasing an etch rate of an upper layer of the low temperature protective film to the discontinuous deposition surface between the gate insulating layer and the protective film by changing film quality of the upper layer of the low temperature protective film. As a result, a defective disconnection between the pad electrode and the pad line can be prevented.

Also, in the FFS LCD device and the method for fabricating the same according to embodiments of the present invention, collective dry etching can be applied in forming the pad portion contact hole, and since a single photolithography process is used, the process is improved.

The foregoing and other objects, features, aspects and advantages of the present invention will become more apparent from the following detailed description of the present invention when taken in conjunction with the accompanying drawings.

DETAILED DESCRIPTION OF THE INVENTION

A fringe field switching (FFS) liquid crystal display (LCD) device and a method of fabricating the same according to embodiments of the present invention will be described in detail with reference to the accompanying drawings.

Figure 1:
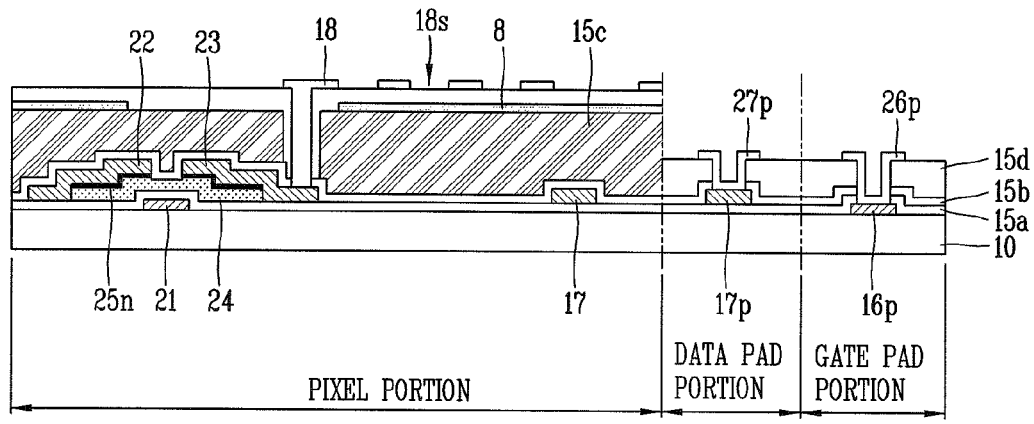
FIG. 1 is a cross-sectional view schematically illustrating a portion of an array substrate of a general fringe field switching (FFS) LCD device.
Figure 2:
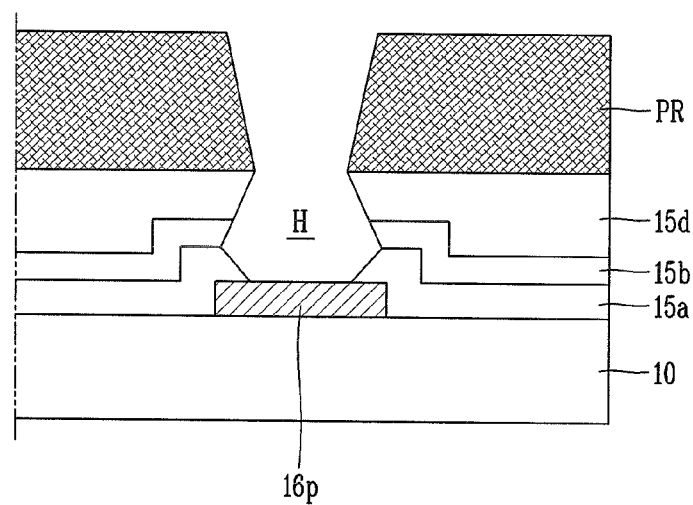
FIG. 2 is a cross-sectional view schematically illustrating a portion of a pad portion of the general FFS LCD device illustrated in FIG. 1.
Figure 3:
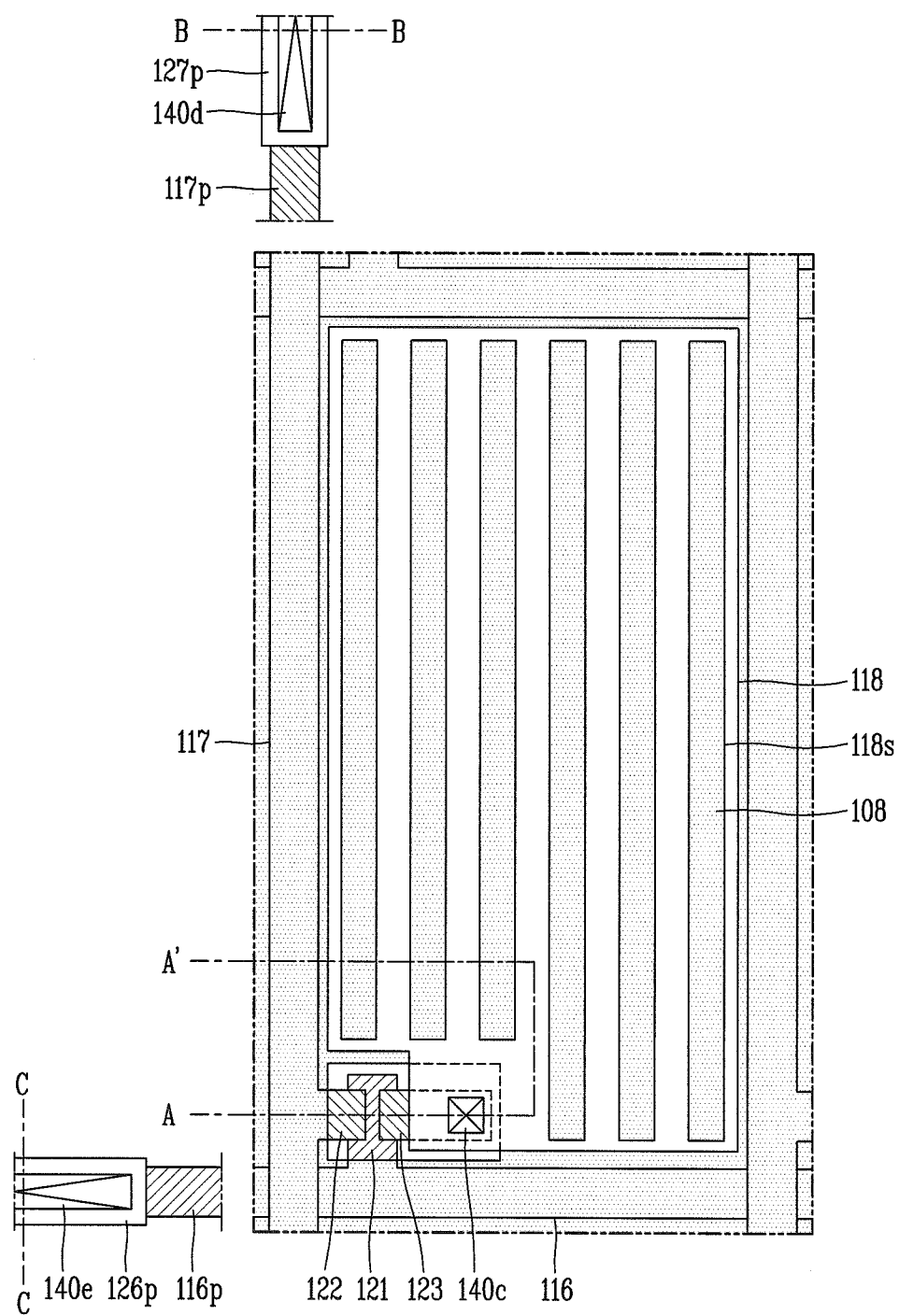
FIG. 3 is a plan view schematically showing a portion of an array substrate of an FFS LCD device according to a first embodiment of the present invention.

FIG. 3 is a schematic plan view showing a portion of an array substrate of an FFS LCD device according to a first embodiment of the present invention, in which an image is displayed as a fringe field formed between a pixel electrode and a common electrode drives liquid crystal molecules positioned in a pixel region and on a pixel electrode through slits.

Figure 4:
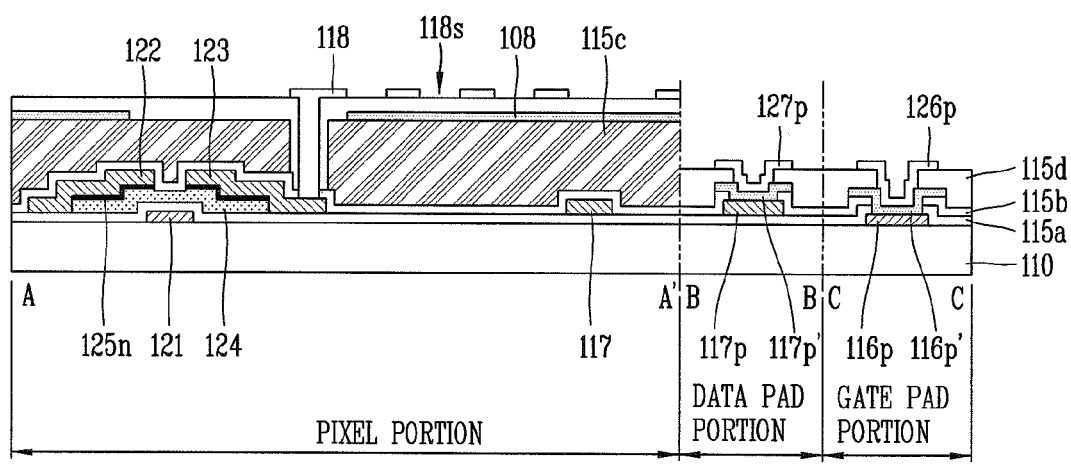
FIG. 4 is a sectional view schematically showing a portion of the array substrate of the FFS LCD device according to the first embodiment of the present invention.

Also, FIG. 4 is a schematic sectional view showing a portion of the array substrate of the FFS LCD device according to the first embodiment of the present invention, taken along lines A-A', B-B, and C-C of the array substrate illustrated in FIG. 3.

Here, a single pixel including a pixel portion, a data pad portion, and a gate pad portion is illustrated for description purpose. N number of gate lines and M number of data lines intersect to create M×N number of pixels exist in an actual LCD device. For the sake of explanation, a single pixel is illustrated in the drawings.

As illustrated in the drawings, a gate line 116 and a data line 117 are formed to be arranged horizontally and vertically, respectively, to define a pixel region on the array substrate 110 according to a first embodiment of the present invention. Also, a thin film transistor (TFT), a switching element, is formed at the intersection of the gate line 116 and the data line 117. A common electrode 108 and a pixel electrode 118 having a plurality of slits 118s are formed in the pixel region and generate a fringe field to drive liquid crystal molecules.

The TFT includes a gate electrode 121 connected to the gate line 116, a source electrode 122 connected to the data line 117, and a drain electrode 123 electrically connected to the pixel electrode 118. Further, the TFT includes a gate insulating layer 115a insulating the gate electrode 121 and the source and drain electrodes 122 and 123, and an active layer 124 forming a conductive channel between the source electrode 122 and the drain electrode 123 by a gate voltage supplied to the gate electrode 121.

Here, the source and drain regions of the active layer 124 form ohmic-contact with the source and drain electrodes 122 and 123 through an ohmic-contact layer 125n.

A portion of the source electrode 122 extends in one direction so as to be connected to the data line 117, and a portion of the drain electrode 123 extends toward the pixel region so as to be electrically connected to the pixel electrode 118 through a third contact hole 140c formed in a first protective film 115b, a second protective film 115c, and a third protective film 115d.

As described above, the common electrode 108 and the pixel electrode 118 are formed to generate a fringe field in the pixel region. The common electrode 108 may be formed as a single pattern over the entire pixel portion excluding the TFT region, and the pixel electrode 118 may be formed to have a box-like shape in the pixel region and have a plurality of slits 118s within each pixel region.

However, the present invention is not limited thereto and the common electrode 108 and the pixel electrode 118 may have be of any structure as long as a fringe field can be generated within the pixel region through the common electrode 108 and the pixel electrode 118 having the plurality of slits 118s to drive liquid crystal molecules. Also, the present invention may be applicable to a case in which a fringe field is generated within the pixel region through the pixel electrode and the common electrode having a plurality of slits to drive liquid crystal molecules.

Meanwhile, a gate pad electrode 126p and a data pad electrode 127p are formed on edge regions of the array substrate 110 and electrically connected to the gate line 116 and the data line 117. The gate pad electrode 126p and the data pad electrode 127p deliver a scan signal and a data signal received from an external driving circuit unit (not shown) to the gate line 116 and the data line 117, respectively.

Namely, the gate line 116 and the data line 117 extend toward the driving circuit unit so as to be connected to the corresponding gate pad line 116p and data pad line 117p, respectively, and the gate pad line 116p and the data pad line 117p receive a scan signal and a data signal from the driving circuit unit through the gate pad electrode 126p and the data pad electrode 127p electrically connected to the gate pad line 116p and the data pad line 117p, respectively.

The data pad line 117p is electrically connected to a data pad line 117p' through a first contact hole (not shown), and the data pad line 117p' is electrically connected to the data pad electrode 127p through a fourth contact hole 140d. Also, the gate pad line 116p is electrically connected to the gate pad line pattern 116p' through a second contact hole (not shown), and the gate pad line 116p' is electrically connected to the gate pad electrode 126p through a fifth contact hole 140e.

In the FFS LCD device according to the first embodiment of the present invention configured as described above, when an organic insulating layer such as photoacryl is used as the second protective film 115c in order to implement low power consumption, the upper third protective film 115d is formed at a process temperature lower than that of the preceding process, namely, the photoacryl curing process.

In this case, in the related art, when a pad portion contact hole is formed, an undercut is formed within the pad portion contact hole, but in the case of the first embodiment of the present invention, after the first and second contact holes are formed by performing dry etching on the lower gate insulating layer 115a and the first protective film 115b, the fourth contact hole 140d and the fifth contact hole 140e are formed by etching the third protective film 115e through a separate dry etching process, thus solving the foregoing undercut problem.

However, in case of the FFS LCD device according to the first embodiment of the present invention requires dry etching, i.e., a photolithography process, two times to form a pad portion contact hole, so one photolithography process is added.

Hereinafter, a method for fabricating an FFS LCD device according to a first embodiment of the present invention will be described in detail with reference to the accompanying drawings.

FIGS. 5A to 5G are plan views sequentially illustrating a process of fabricating the array substrate illustrated in FIG. 3.

FIGS. 6A to 6G are sectional views illustrating the sequence of a process of fabricating the array substrate illustrated in FIG. 4, in which the left side shows a process of fabricating the array substrate of the pixel portion, and the right side shows a process of fabricating an array substrate of the data pad portion and the gate pad portion sequentially.

Figure 5A:
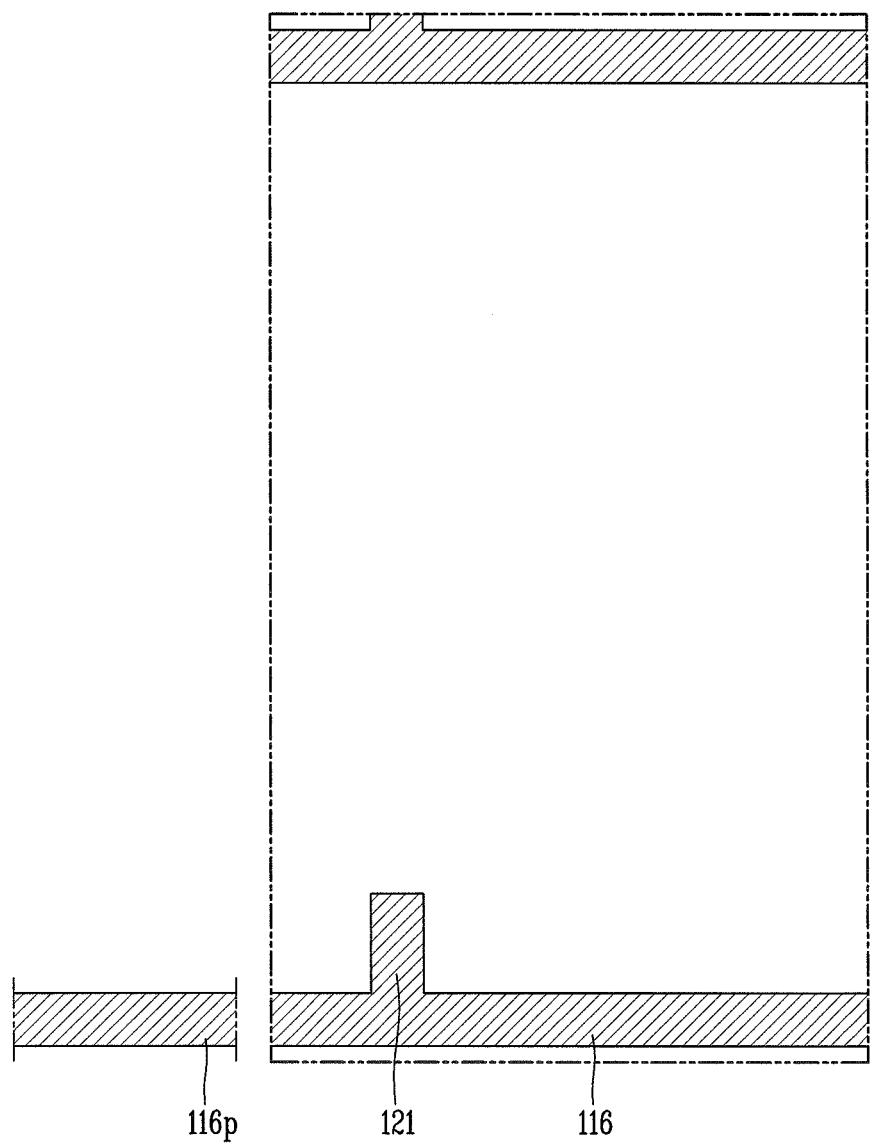
FIGS. 5A to 5G are plan views sequentially illustrating a process of fabricating the array substrate illustrated in FIG. 3.
Figure 6A:
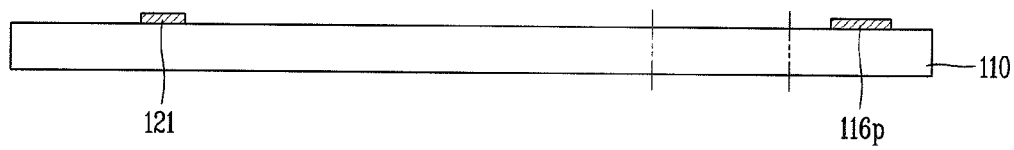
FIGS. 6A to 6G are sectional views illustrating a sequence of a process of fabricating the array substrate illustrated in FIG. 4.

As illustrated in FIGS. 5A and 6A, the gate electrode 121 and the gate line 116 made of a transparent insulating material such as glass are formed in the pixel portion of the array substrate 110, and the gate pad line 116p is formed in the gate pad portion of the array substrate 110.

The gate electrode 121, the gate line 116, and the gate pad line 116p are formed by depositing a first conductive film on the entire surface of the array substrate 110 and subsequently selectively patterning the first conductive film through a photolithograph process (a first masking process).

The first conductive film may be made of a low-resistivity opaque conductive material such as aluminum (Al), an Al alloy, tungsten (W), copper (Cu), chromium (Cr), molybdenum (Mo), a Mo alloy, and the like. Also, the first conductive film may have a multilayered structure by stacking two or more types of low-resistivity conductive materials.

Figure 5B:
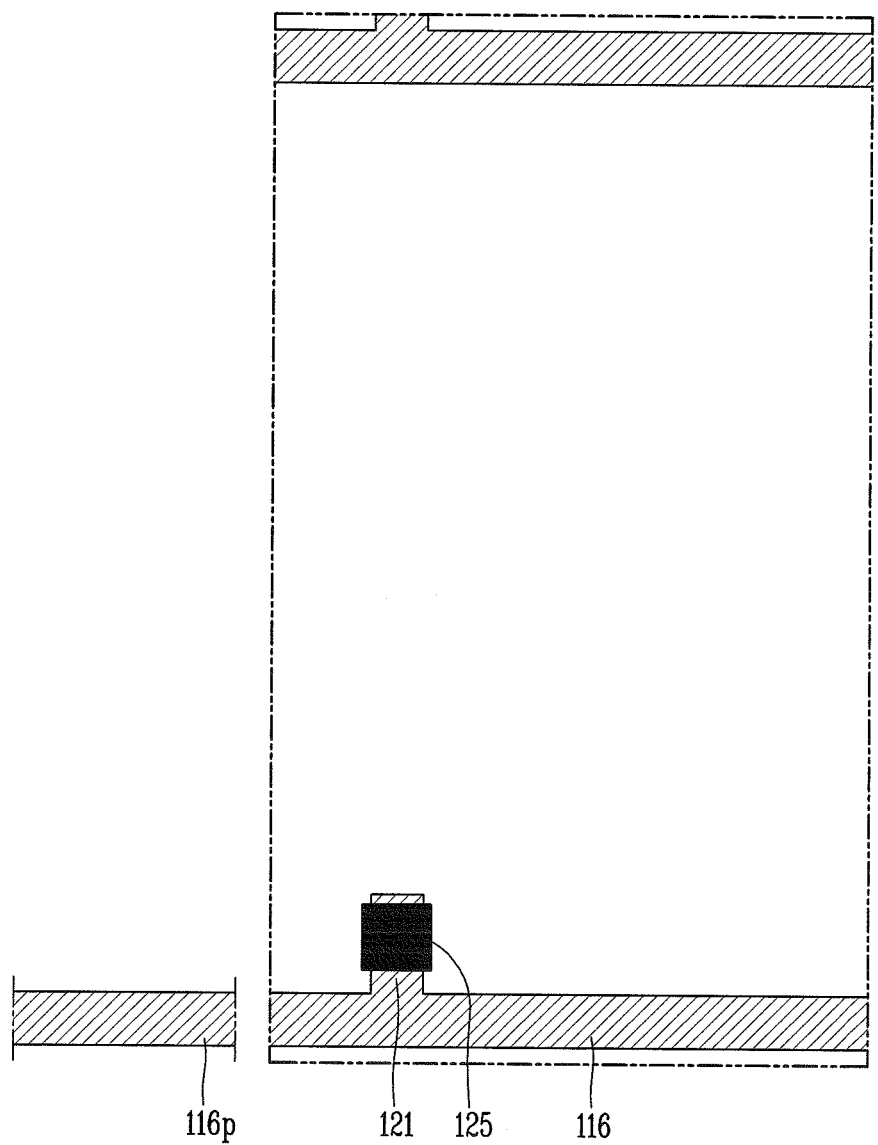
Figure 6B:
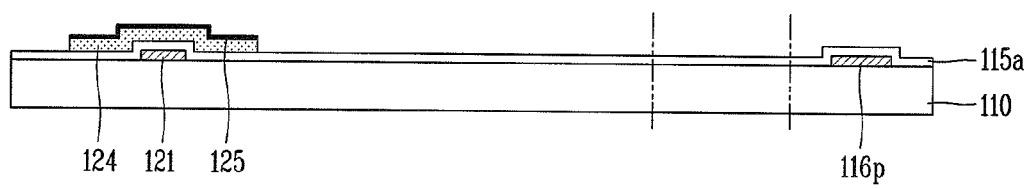

Next, as shown in FIGS. 5B and 6B, the gate insulating layer 115a, an amorphous silicon thin film and an n+ amorphous silicon thin film are formed on the entire surface of the array substrate 110 with the gate electrode 121, the gate line 116, and the gate pad line 116p formed thereon.

Thereafter, the amorphous silicon thin film and the n+ amorphous silicon thin film are selectively removed through a photolithography process (a second masking process) to form the active layer 124 formed of the amorphous silicon thin film in the pixel portion of the array substrate 110.

The n+ amorphous silicon thin film patterned to have substantially the same shape as that of the active layer 124 is formed on the active layer 124.

Figure 5C:
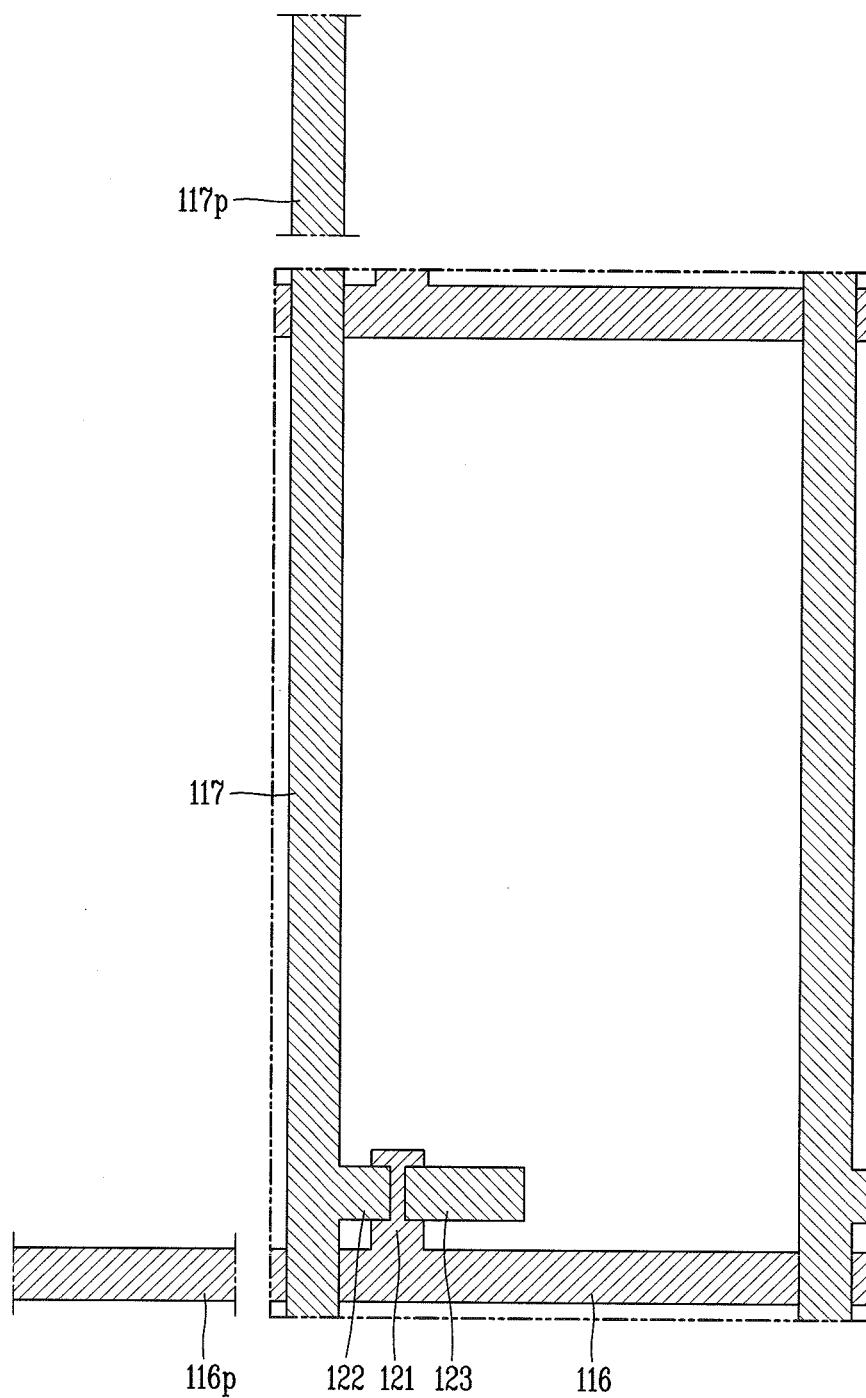
Figure 6C:
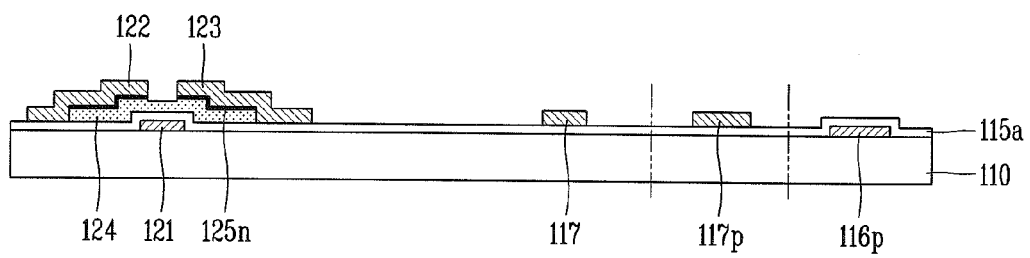

Next, as shown in FIGS. 5C and 6C, a second conductive film is formed on the entire surface of the array substrate 110 with the active layer 124 and the n+ amorphous silicon thin film pattern 125 formed thereon. Here, the second conductive film may be made of a low-resistivity opaque conductive material such as aluminum (Al), an Al alloy, tungsten (W), copper (Cu), nickel (Ni), chromium (Cr), molybdenum (Mo), a Mo alloy, and the like, in order to form a source electrode, a drain electrode, and a data line. Also, the second conductive film may have a multilayered structure by stacking two or more types of low-resistivity conductive materials.

Thereafter, the n+ amorphous silicon thin film and the second conductive film are selectively removed through a photolithography process (a third masking process) to form the source electrode 122 and the drain electrode 123 formed of the second conductive film in an upper portion of the active layer 124.

Here, as soon as the data line 117 formed of the second conductive film in the data line region of the array substrate 110 through the third masking process, the data pad line 117p formed of the second conductive film is formed in the data pad portion of the array substrate 110.

Here, the ohmic-contact layer 125n formed of the n+ amorphous silicon thin film and allowing the source and drain region of the active layer 124 and the source and drain electrodes 122 and 123 to be in ohmic-contact with each other is formed on an upper portion of the active layer 124.

Figure 5D:
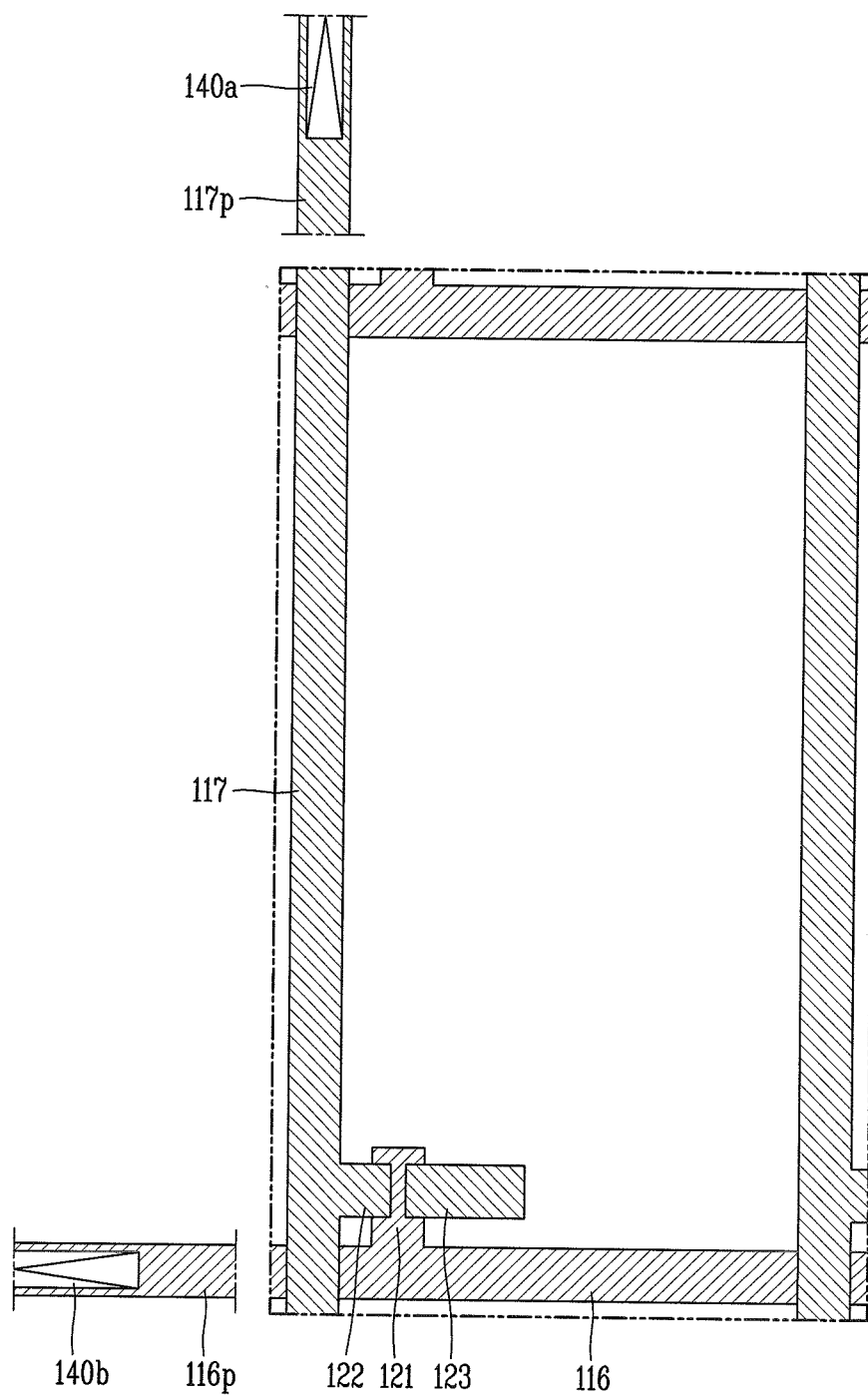
Figure 6D:
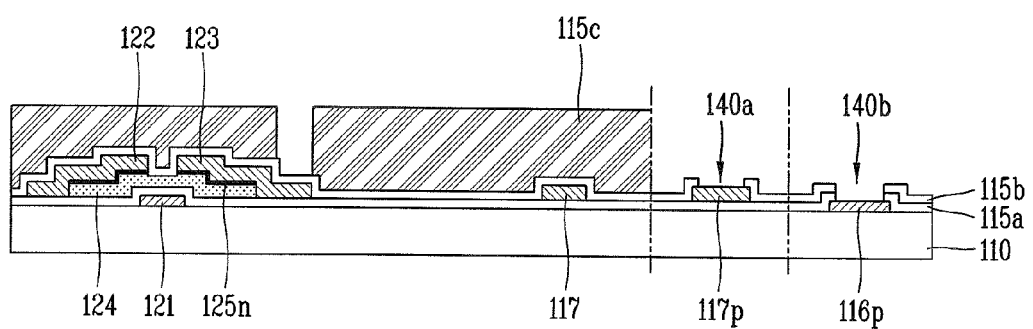

And then, as shown in FIGS. 5D and 6D, the first protective film 115b is formed on the entire surface of the array substrate 110 with the source and drain electrodes 122 and 123, the data line 117, and the data pad line 117p formed thereon. The first protective film 115b may be formed of an inorganic insulating layer such as a silicon nitride film (SiNx), a silicon oxide film ($SiO_2$).

Thereafter, the first protective film 115b is selectively removed through a photolithography process (a fourth masking process) to form the first contact hole 140a and the second contact hole 140b exposing portions of the data pad line 117p and the gate pad line 116p on the data pad portion and the gate pad portion of the array substrate 110.

And then, the second protective film 115b formed of an organic insulating layer such as photoacryl is formed on the entire surface of the array substrate 110 and subsequently exposed and developed through a photolithography process (a fifth masking process) to expose an upper portion of the drain electrode 123 and the entirety of the data pad portion and the gate pad portion. Here, the second protective film 115c may include a component such as acrylate, polyimide, epoxy, or the like.

Thereafter, a certain curing process is performed to cure the second protective film 115b as the organic insulating layer.

Figure 5E:
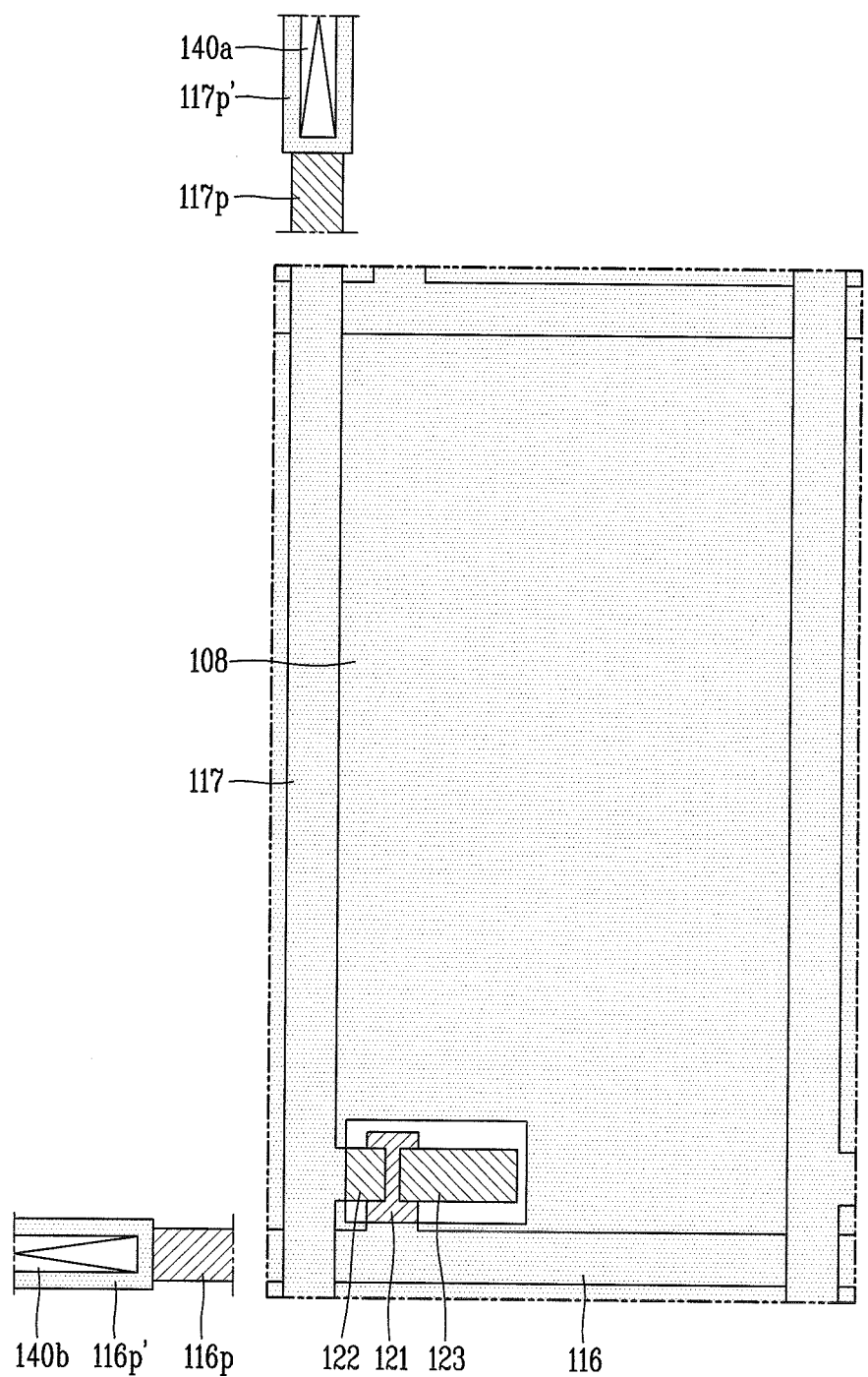
Figure 6E:
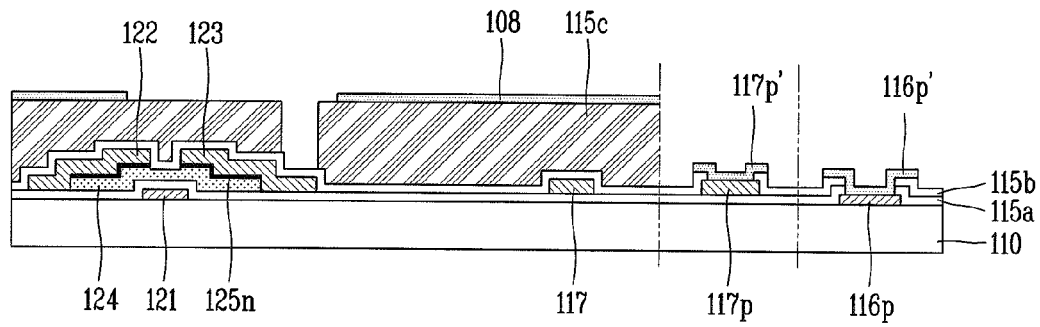

Thereafter, as show in FIGS. 5E and 6E, a third conductive film is formed on the entire surface of the array substrate 110 with the second protective film 115c formed thereon, and selectively removed through a photolithography (a sixth masking process) to form the common electrode 108 formed of the third conductive film in the pixel portion of the array substrate 110.

Also, the data pad line pattern 117p' and the gate pad line pattern 116p' made of the third conductive film are formed in the data pad portion and the gate pad portion of the array substrate 110 through the fifth masking process.

The third conductive film may be made of a transparent conductive material having excellent transmissivity such as indium tin oxide (ITO) or indium zinc oxide (IZO) to form the common electrode 108, the data pad line pattern 117p', and the gate pad line pattern 116p'.

The common electrode 108 may be formed as a single pattern over the entire pixel portion excluding a contact region between the drain electrode 123 and the pixel electrode to allow the drain electrode 123 (to be formed) and the pixel electrode to be connected.

Also, the data pad line pattern 117p' is electrically connected to the lower data pad line 117p through the first contact hole 140a, and the gate pad line pattern 116p' is electrically connected to the lower gate pad line 116p through the second contact hole 140b.

Figure 5F:
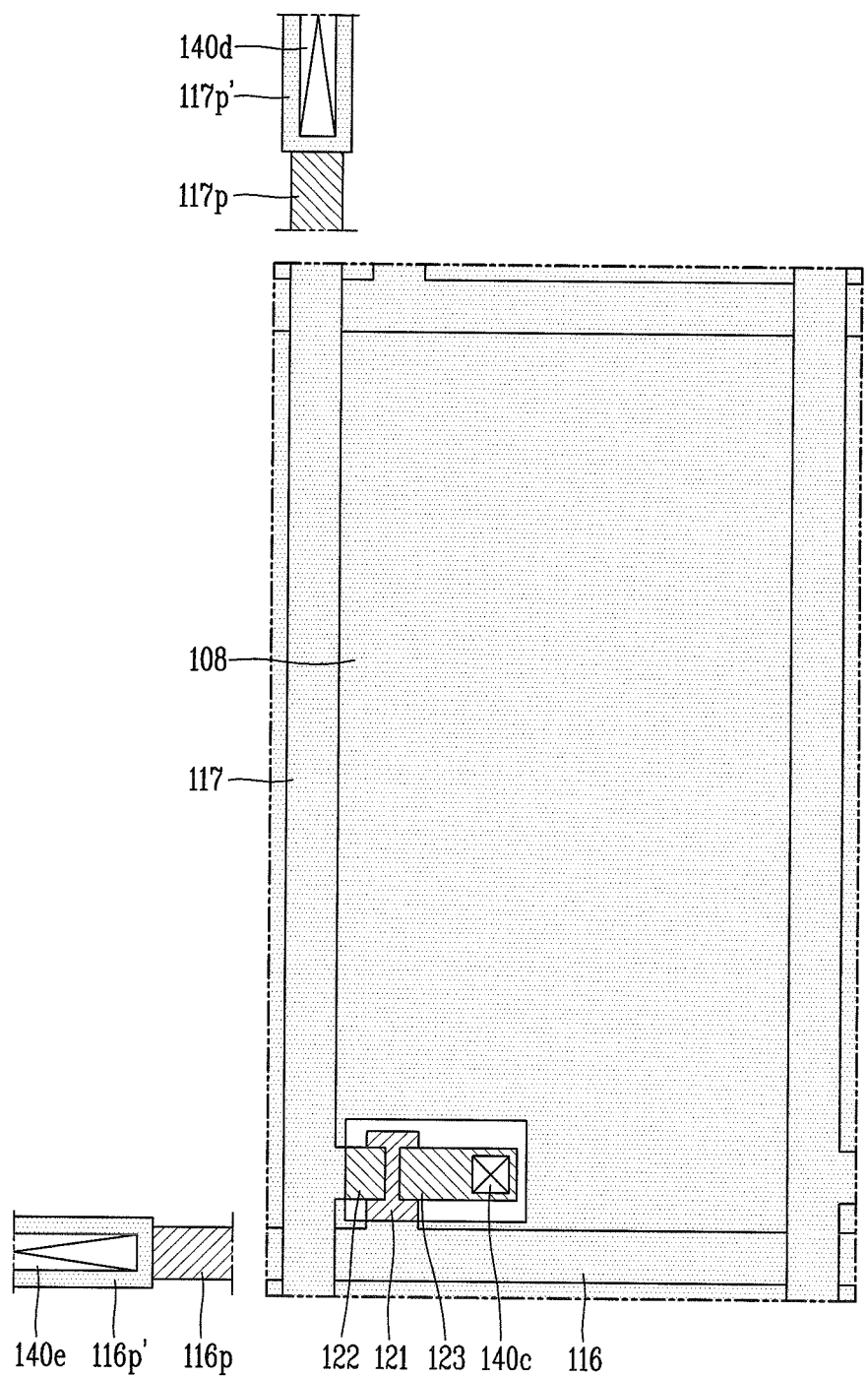
Figure 6F:
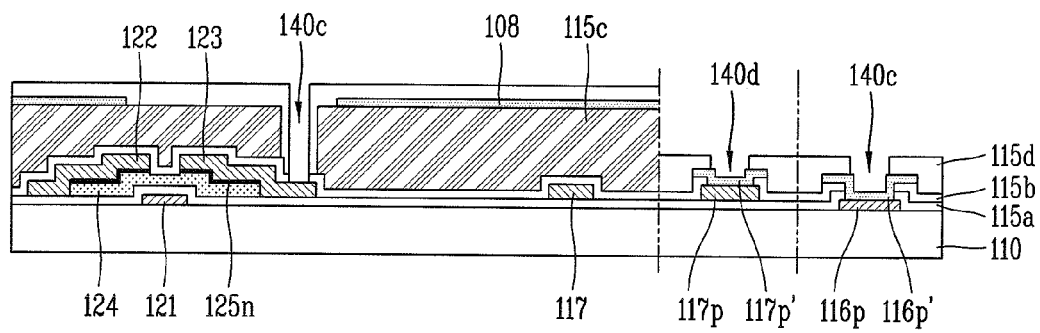

Next, as shown in FIGS. 5F and 6F, the third protective film 115d is formed on the entire surface of the array substrate 110 with the common electrode 108, the data pad line pattern 117p', and the gate pad line pattern 116p' formed thereon.

Here, the third protective film 115d may be formed of an inorganic insulating layer such as a silicon nitride film or a silicon oxide film, and in case the lower second protective film 115c is formed as an organic insulating layer, the third protective film 115d is formed at a process temperature lower than that of a preceding process, i.e., a curing process, of the second protective film 115c.

Thereafter, the third protective film 115d and the first protective film 115b are selectively removed through a photolithography process (a seventh masking process) to form the third contact hole 140c exposing a portion of the drain electrode 123 and the fourth contact hole 140d and the fifth contact hole 140e exposing portions of the data pad line pattern 117p' and the gate pad line pattern 116p' in the data pad portion and the gate pad portion of the array substrate 110.

Figure 5G:
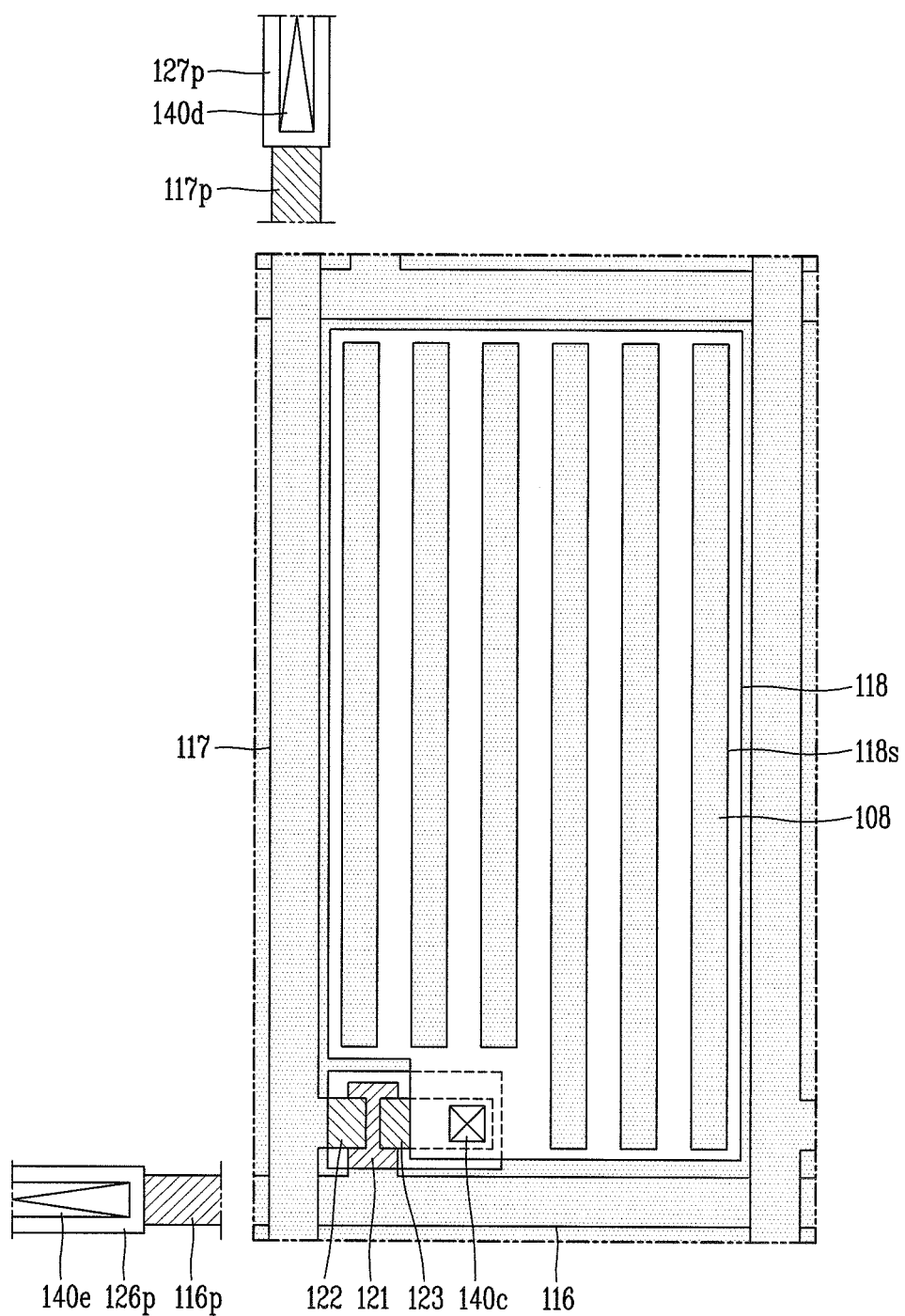
Figure 6G:
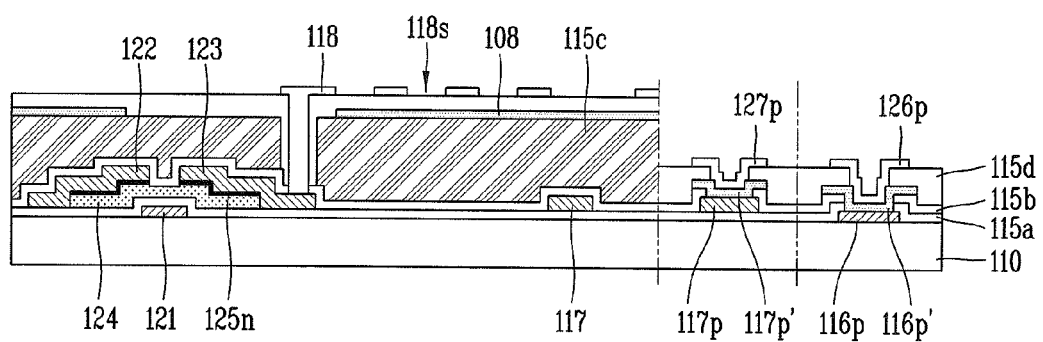

Next, as shown in FIGS. 5G and 6G, a fourth conductive film made of a transparent conductive material is formed on the entire surface of the array substrate 110 with the third protective film 115d formed thereon, and selectively patterned by using a photolithography process (an eighth masking process) to form the pixel electrode 118 having a plurality of slits 118s electrically connected to the drain electrode 123 through the third contact hole 140c in the pixel region of the array substrate 110.

Here, the fourth conductive film is selectively patterned by using the eighth masking process to form the data pad electrode 127p and the gate pad electrode 126p electrically connected to the data pad line pattern 117p' and the gate pad line pattern 116p' through the fourth contact hole 140d and the fifth contact hole 140e in the data pad portion and the gate pad portion, respectively.

Thus, in the FFS LCD device according to the first embodiment of the present invention, since dry etching is performed on the gate insulating layer and the first protective film through the fourth masking process, and thereafter, the third protective film is etched through separate dry etching of the seventh masking process to form the pad portion contact hole, thus solving the foregoing undercut problem.

In this case, however, the FFS LCD device according to the first embodiment of the present invention requires two times of dry etching, namely, two times of masking process, to form the pad portion contact hole, one masking process is added.

Thus, the undercut within the pad portion contact hole may be improved by increasing an etch rate of an upper layer of the third protective film to a discontinuous deposition surface between the gate insulating layer and the first and third protective films by changing film quality of the upper layer of the low temperature protective film (i.e., the third protective film) without additionally performing a masking process. This will be described in detail through second and third embodiments of the present invention.

Figure 7:
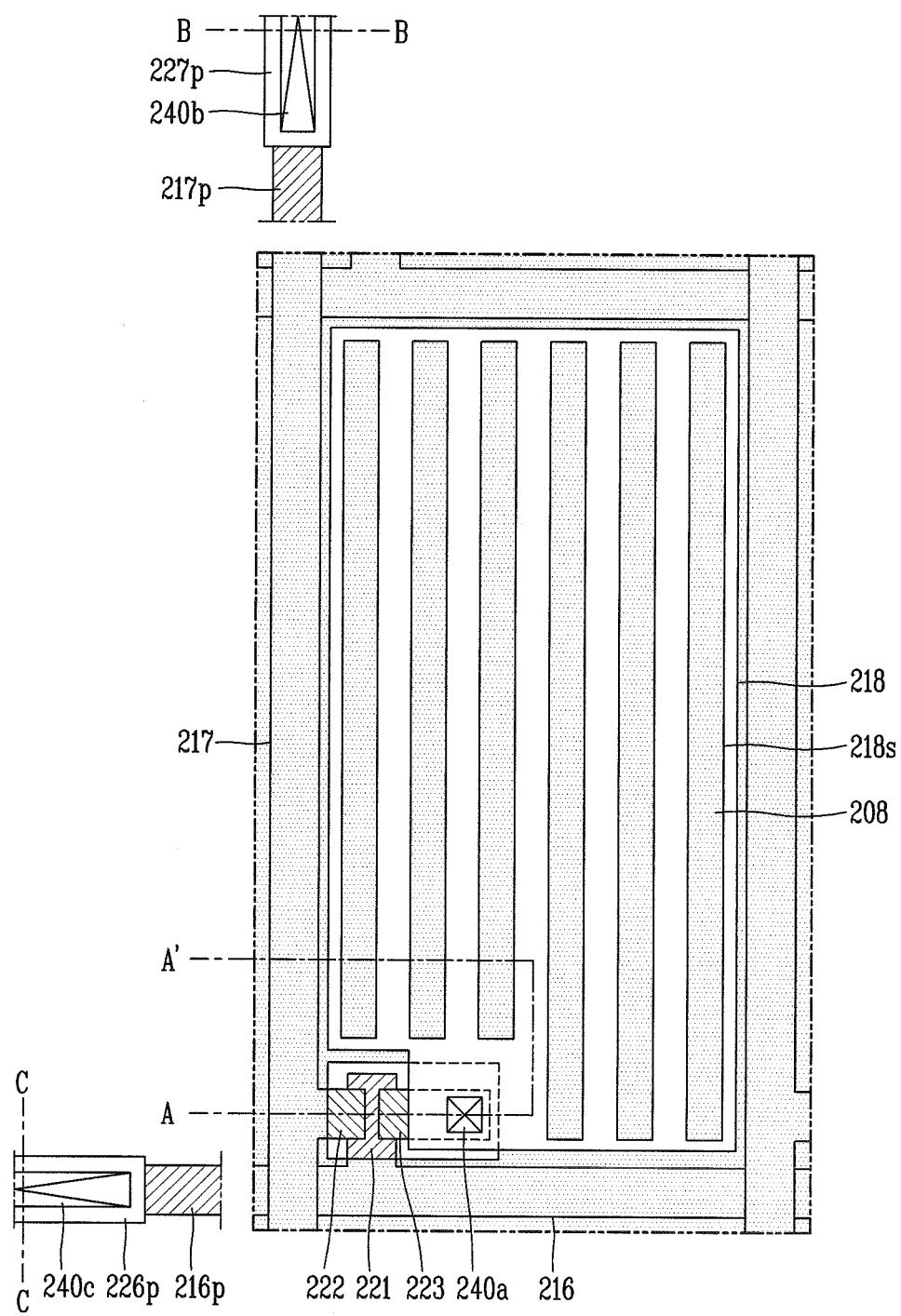
FIG. 7 is a plan view schematically illustrating a portion of an array substrate of an FFS LCD device according to a second embodiment of the present invention.

FIG. 7 is a schematic plan view illustrating a portion of an array substrate of an FFS LCD device according to a second embodiment of the present invention.

Figure 8:
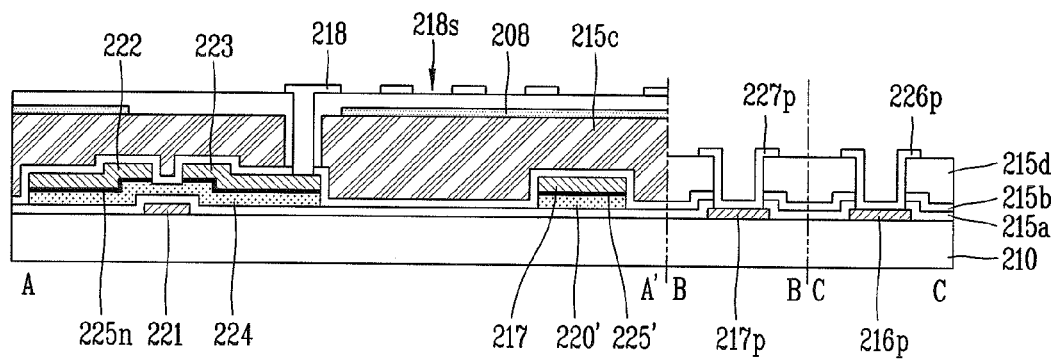
FIG. 8 is a sectional view schematically illustrating a portion of the array substrate of the FFS LCD device according to the second embodiment of the present invention.

FIG. 8 is a schematic sectional view illustrating a portion of the array substrate of the FFS LCD device according to the second embodiment of the present invention, taken along lines A-A', B-B, and C-C of the array substrate illustrated in FIG. 7.

Here, as mentioned above, single pixel including a pixel portion, a data pad portion, and a gate pad portion is illustrated for description purpose. N number of gate lines and M number of data lines intersect so M×N number of pixels exist in an actual LCD device. But for the sake of explanation, a single pixel is illustrated in the drawings.

As illustrated in the drawings, a gate line 216 and a data line 217 are formed to be arranged vertically and horizontally to define a pixel region on the array substrate 210 according to a first embodiment of the present invention. Also, a thin film transistor (TFT) is formed at an intersection of the gate line 216 and the data line 217 as a switching element. A common electrode 208 and a pixel electrode 218 having a plurality of slits 218s are formed to generate a fringe field to drive liquid crystal molecules in the pixel region.

The TFT includes a gate electrode 221 connected to the gate line 216, a source electrode 222 connected to the data line 217, and a drain electrode 223 electrically connected to the pixel electrode 218. Further, the TFT includes a gate insulating layer 215a insulating the gate electrode 221 and the source and drain electrodes 222 and 223, and an active layer 224 forming a conductive channel between the source electrode 222 and the drain electrode 223 by a gate voltage supplied to the gate electrode 221.

The source and drain regions of the active layer 224 form ohmic-contact with the source and drain electrodes 222 and 223 through an ohmic-contact layer 225n.

A portion of the source electrode 222 extends in one direction so as to be connected to the data line 217, and a portion of the drain electrode 223 extends toward the pixel region so as to be electrically connected to the pixel electrode 218 through a third contact hole 240c formed in a first protective film 215b, a second protective film 215c, and a third protective film 215d.

In the case of the second embodiment, the active layer 224 and the data wiring (i.e., the source electrode 222), the drain electrode 223, and the data line 217, are simultaneously patterned through the same masking process, whereby one masking process can be reduced. Thus, the active layer 224 and the source and drain electrodes 222 and 223 may be patterned to have the substantially same shape, and an amorphous silicon thin film pattern 220' and an n+ amorphous silicon thin film pattern 225' formed of an amorphous silicon thin film and n+ amorphous silicon thin film are formed under the data line 217, respectively, but the present invention is not limited thereto.

As described above, the common electrode 208 and the pixel electrode 218 are formed to generate a fringe field in the pixel region, and here, the common electrode 208 may be formed as a single pattern over the entire pixel portion excluding the TFT region, and the pixel electrode 218 may be formed to have a box-like shape in the pixel region and have a plurality of slits 218s within each pixel region.

However, the present invention is not limited thereto and the common electrode 208 and the pixel electrode 218 may be of any structure as long as a fringe field can be generated within the pixel region through the common electrode 208 and the pixel electrode 218 having the plurality of slits 218s to drive liquid crystal molecules. Also, the present invention may be applicable to a case in which a fringe field is generated within the pixel region through the pixel electrode and the common electrode having a plurality of slits to drive liquid crystal molecules.

Meanwhile, a gate pad electrode 226p and a data pad electrode 227p are formed on edge regions of the array substrate 210 and electrically connected to the gate line 216 and the data line 217. The gate pad electrode 226p and the data pad electrode 227p deliver a scan signal and a data signal received from an external driving circuit unit (not shown) to the gate line 216 and the data line 217, respectively.

Namely, the gate line 216 and the data line 217 extend toward the driving circuit unit so as to be connected to the corresponding gate pad line 216p and data pad line 217p, respectively, and the gate pad line 216p and the data pad line 217p receive a scan signal and a data signal from the driving circuit unit through the gate pad electrode 226p and the data pad electrode 227p electrically connected to the gate pad line 216p and the data pad line 217p, respectively.

The data pad line 217p is electrically connected to the data pad electrode 227p through the second contact hole 240b, and the gate pad line 216p is electrically connected to the gate pad electrode 226p through the third contact hole 240c.

The data pad line 217p according to the second embodiment of the present invention is formed on the same layer on which the gate pad line 216 is formed 216p, through the same masking process, but the present invention is not limited thereto.

In the FFS LCD device according to the second embodiment of the present invention configured as described above, when an organic insulating layer such as photoacryl is used as the second protective film 215c in order to implement low power consumption, the upper third protective film 215d is formed at a process temperature, e.g., at 230, lower than that of the preceding process, namely, the photoacryl curing process.

In this case, in the related art, when a pad portion contact hole is formed, an undercut is formed within the pad portion contact hole, but in the case of the second embodiment of the present invention, film quality of an upper layer of the third protective film 215d is changed to increase an etch rate of the upper layer of the third protective film 215d to a discontinuous deposition surface between the gate insulating layer 215a and the first and third protective films 215b and 215d, thus improving undercut within the pad portion contact holes 240b and 240c without performing an additional masking process.

Figure 9:
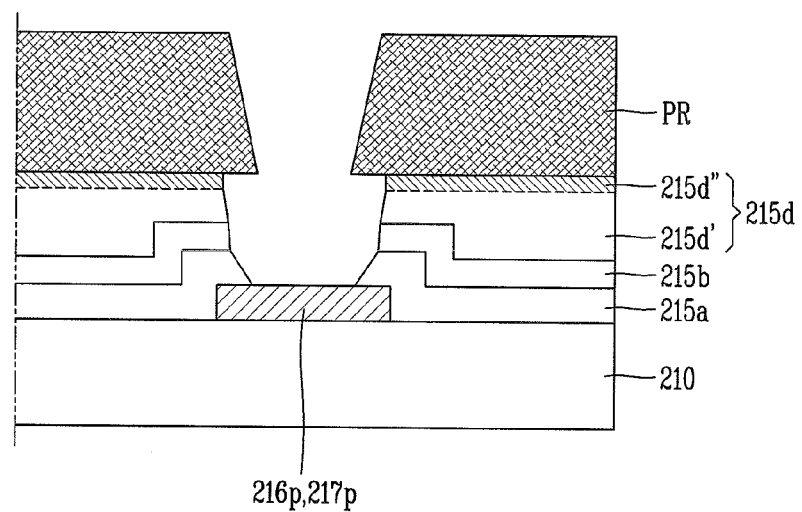
FIG. 9 is a sectional view schematically illustrating a portion of a pad portion of the FFS LCD device according to the second embodiment of the present invention illustrated in FIG. 8.

FIG. 9 is a sectional view schematically illustrating a portion of a pad portion of the FFS LCD device according to the second embodiment of the present invention illustrated in FIG. 8. Specifically, FIG. 9 shows a section of the gate/data pad portion in the process of forming a contact hole.

Referring to FIG. 9, when the third protective film 215d is deposited at a low temperature, an Si—N bonding ratio is so low to have porosity, and in particular, in case of depositing an upper layer 215d'' of the third protective film 215d to have more porosity than that of a lower layer 213d', although the gate insulating layer 215a, the first protective film 215b, and the third protective film 215d are collectively dry-etched, an etch rate of the upper layer 215d'' of the third protective film 215d to a discontinuous deposition surface between the gate insulating layer 215a and the first and third protective films 215b and 215d is so high that the pad portion contact holes 240b and 240c tapered in a forward direction can be formed.

For reference, reference letters PR denote a photoresist pattern for forming the pad portion contact holes 240b and 240c.

Figure 10:
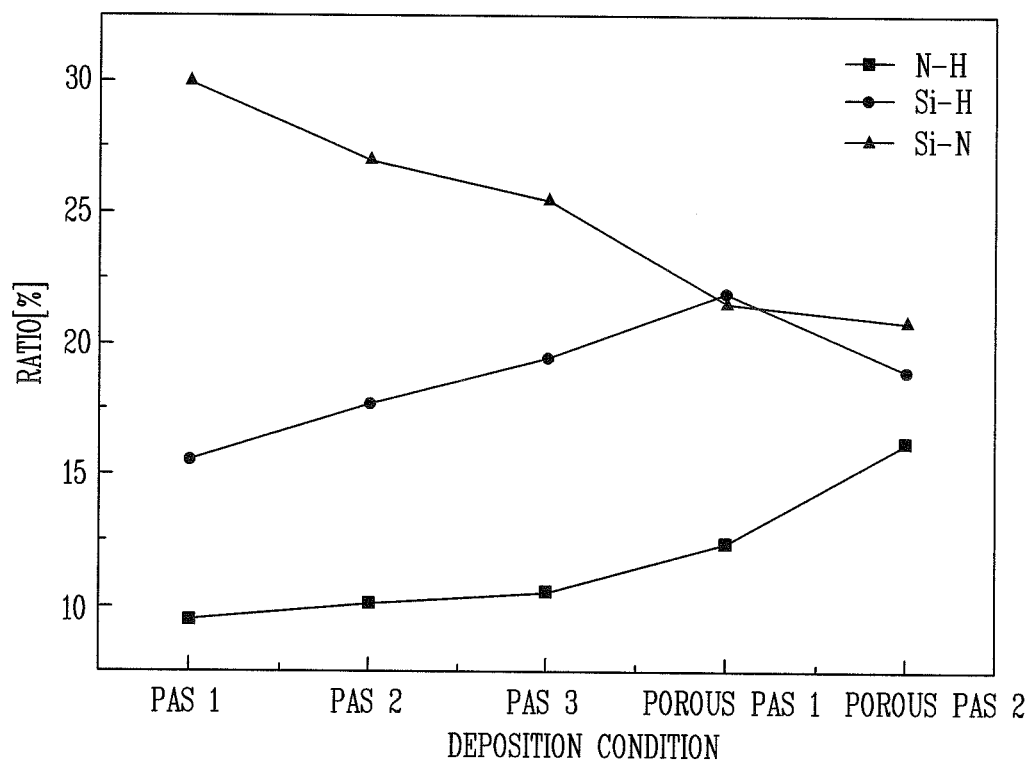
FIG. 10 is a graph showing a ratio of a Si—N and Si—H bonding according to a deposition condition of a low temperature protective film.

FIG. 10 is a graph showing a ratio of an Si—N and Si—H bonding according to a deposition condition of a low temperature protective film. Specifically, FIG. 10 shows results obtained from analysis using infrared spectroscopic analysis (FT-IR).

PAS1, PAS2, PAS3, Porous PAS1, and Porous PAS2 illustrated in FIG. 10 represent protective films deposited by gradually increasing a ratio of the Si—H/Si—N bonding (i.e., a gas ratio). For example, a ratio of NH3 gas to SiH4 gas may be increased from 1:3 to 1:4 or greater and a flow rate of N2 gas may be reduced from 100% to less than 100%.

Referring to FIG. 10, the results of checking a change in the characteristics according to the deposition conditions of the low temperature protective film show that there is difference in the characteristics of the low temperature protective film according to the depositions conditions.

Namely, in case of PAS1, PAS2, and PAS3, when the ratio of the Si—N/Si—N bonding is 1, a ratio of the Si—H/Si—N bonding appears to range from 0.5 to 0.8, and in case of POROUS PAS1 and POROUS PAS2, a ratio of the Si—H/Si—N bonding is 1 or greater. According to the FT-IR analysis result, it can be seen that the ratio of the Si—H and Si—N bonding is changed from 1:2 to 1:1.

By depositing the upper layer of the third protective film such that it has porous film quality (more than the lower layer of the third protective film) by reducing the relative Si—N bond of the upper layer of the third protective film, in comparison to the discontinuous deposition surface between the gate insulating layer and the first and third protective films having vulnerable interface therebetween, the pad portion contact hole tapered in the forward direction may be formed. In this case, for example, the ratio of the $NH_3$ gas to the $SiH_4$ gas may be increased from 1:3 to 1:4, a flow rate of the $N_2$ gas may be reduced from 100% to less than 100%, and a thickness of the upper layer of the third protective film over the total thickness of the third protective layer may range from 5% to 20%.

In this case, the upper layer of the third protective film may be a thin film in which a ratio of the Si—H/Si—N bonding is 80% or more.

For reference, bond dissociation energy of Si—H, Si—N, and N—H is 84 to 104 Kcalmol, 87 to 111 Kcalmol, and 92 Kcalmol, respectively.

Hereinafter, a method for fabricating an FFS LCD device according to the second embodiment of the present invention will be described in detail with reference to the accompanying drawings.

FIGS. 11A to 11E are plan views sequentially illustrating a process of fabricating the array substrate illustrated in FIG. 7.

FIGS. 12A to 12F are sectional views sequentially illustrating a process of fabricating the array substrate illustrated in FIG. 8, in which the left side shows a process of fabricating the array substrate of the pixel portion, and the right side shows a process of fabricating an array substrate of the data pad portion and the gate pad portion sequentially.

Figure 11A:
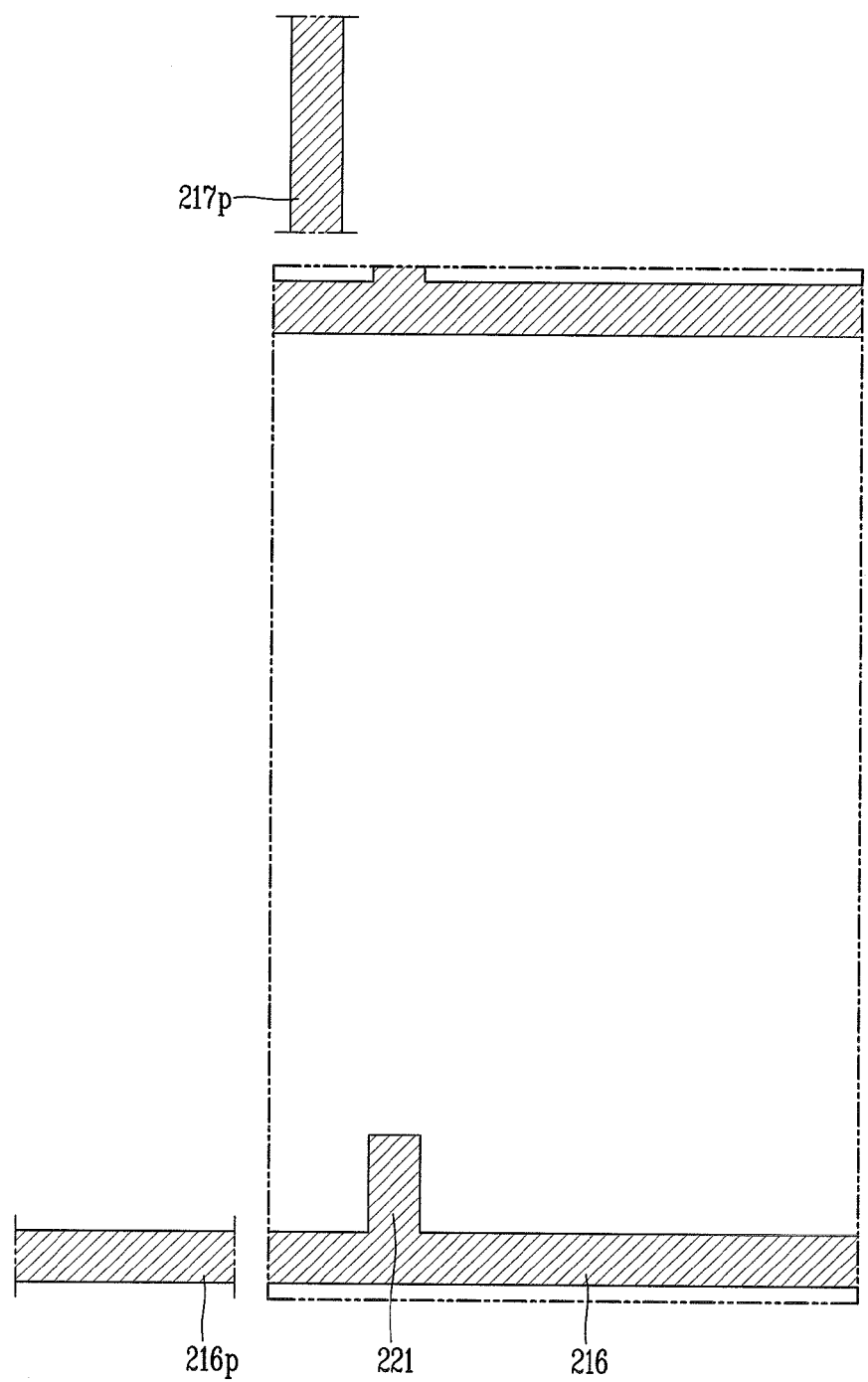
FIGS. 11A to 11E are plan views illustrating a sequence of a process of fabricating the array substrate illustrated in FIG. 7.
Figure 12A:
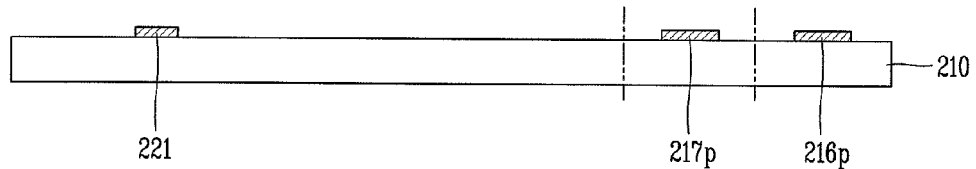
FIGS. 12A to 12F are sectional views illustrating a sequence of a process of fabricating an array substrate illustrated in FIG. 8.

As illustrated in FIGS. 11A and 12A, the gate electrode 221 and the gate line 216 made of a transparent insulating material such as glass are formed in the pixel portion of the array substrate 210, and the gate pad line 216p and the data pad lines 217p are formed in the gate pad portion and the data pad portion of the array substrate 110, respectively. However, the present invention is not limited thereto, and the data pad line 217p may be formed through a different masking process from that of the gate electrode 221, the gate line 216, and the gate pad line 216p.

The gate electrode 221, the gate line 216, the gate pad line 216p, and the data pad line 217p are formed by depositing a first conductive film on the entire surface of the array substrate 110 and subsequently selectively patterning the first conductive film through a photolithograph process (a first masking process).

The first conductive film may be made of a low-resistivity opaque conductive material such as aluminum (Al), an Al alloy, tungsten (W), copper (Cu), chromium (Cr), molybdenum (Mo), a Mo alloy, and the like. Also, the first conductive film may have a multilayered structure by stacking two or more types of low-resistivity conductive materials.

Figure 11B:
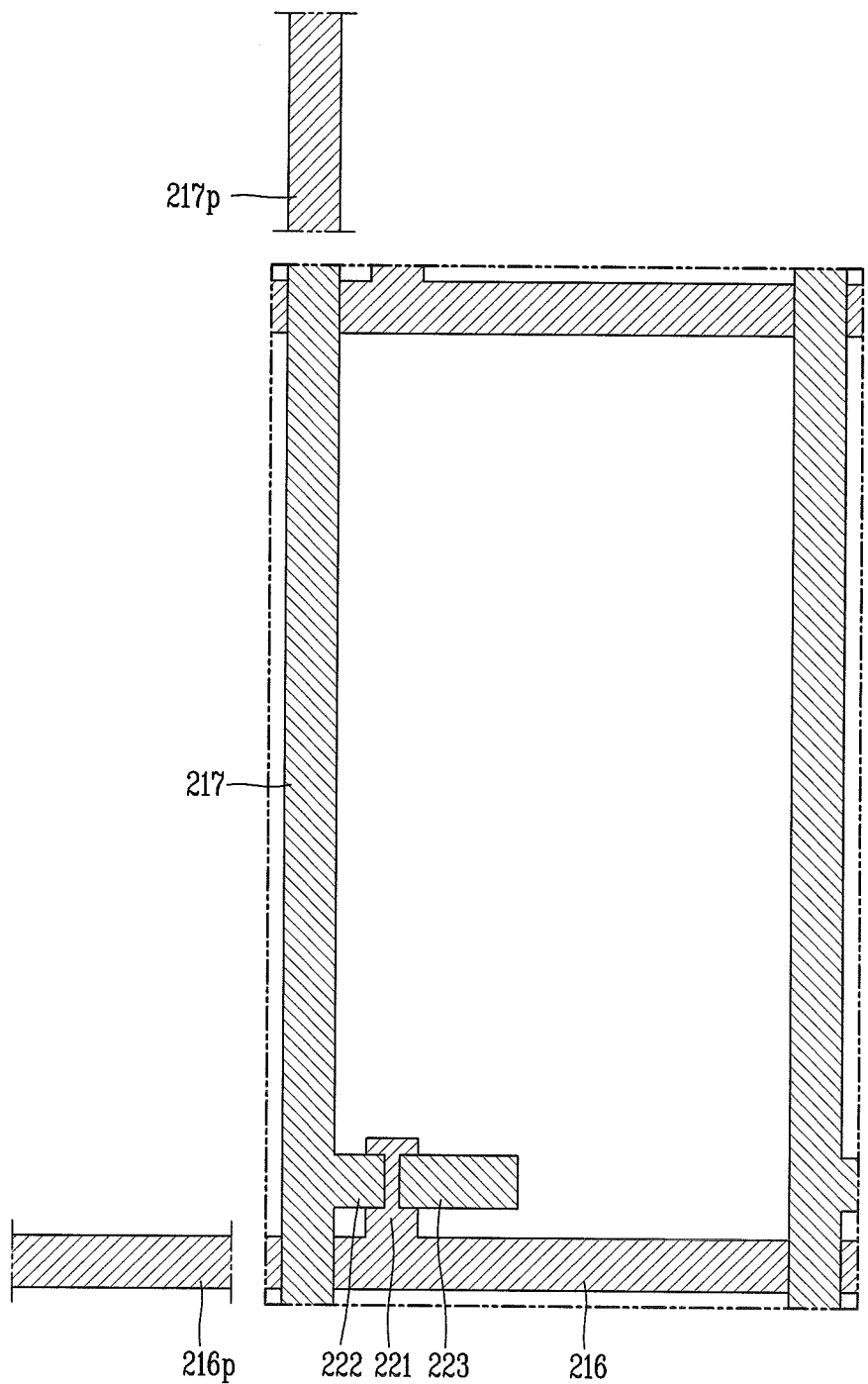
Figure 12B:
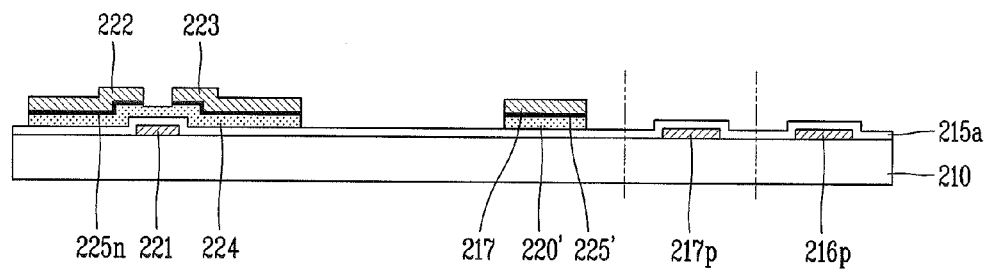

Next, as shown in FIGS. 11B and 12B, the gate insulating layer 215a, an amorphous silicon thin film, an n+ amorphous silicon thin film, and a second conductive film are formed on the entire surface of the array substrate 210 with the gate electrode 221, the gate line 216, the gate pad line 216p, and the data pad line 217p formed thereon.

Here, in order to form a source electrode, a drain electrode, and a data line, the second conductive film may be made of a low-resistivity opaque conductive material such as aluminum (Al), an Al alloy, tungsten (W), copper (Cu), chromium (Cr), molybdenum (Mo), a Mo alloy, and the like. Also, the second conductive film may have a multilayered structure by stacking two or more types of low-resistivity conductive materials.

Thereafter, the amorphous silicon thin film, the n+ amorphous silicon thin film, and the second conductive film are selectively removed through a photolithography process (a second masking process) to form the active layer 224 formed of the amorphous silicon thin film in the pixel portion of the array substrate 210 and the source electrode 222 and the drain electrode 223 formed of the second conductive film on an upper portion of the active layer 224.

The data line 217 formed of the second conductive film is formed in the data line region of the array substrate 210 through the second masking process.

The ohmic-contact layer 225n formed of the n+ amorphous silicon thin film and allowing the source and drain regions of the active layer 224 and the source and drain electrodes 222 and 223 to be in ohmic-contact with each other is formed on an upper portion of the active layer 224. Also, the active layer 224 and the source and drain electrodes 222 and 223 are patterned to have the substantially same shape, and an amorphous silicon thin film pattern 220' and an n+ amorphous silicon thin film pattern 225' formed of the amorphous silicon thin film and the n+ amorphous silicon thin film are formed under the data line 217.

In the case of the second embodiment, since the active layer 224, the data wiring, namely, the source electrode 222, the drain electrode 223, and the data line 217 are simultaneously patterned through the same masking process, whereby one masking process can be reduced. However, the present invention is not limited thereto and the active layer 224 and the data wiring may be separately formed through masking process two times.

Figure 12C:
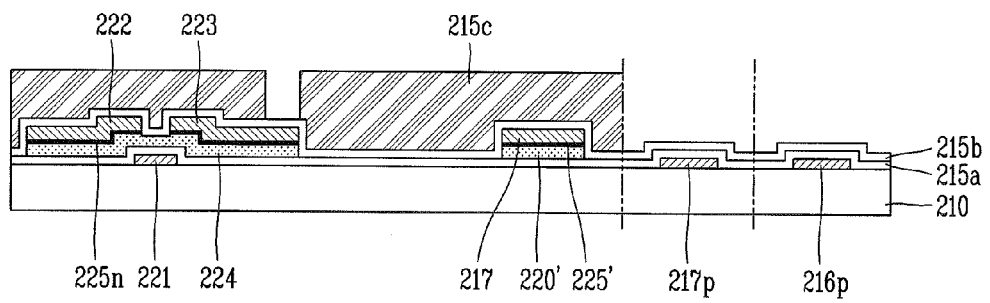

Thereafter, as illustrated in FIG. 12C, the first protective film 215b and the second protective film 215c are formed on the entire surface of the array substrate 210 with the active layer 224, the source and drain electrodes 222 and 223, and the data line 217 formed thereon.

The first protective film 215b may be formed as an inorganic film such as a silicon nitride film or a silicon oxide film, and the second protective film 215c may be formed as an organic insulating layer such as photoacryl including a component such as acrylate, polyimide, epoxy, or the like.

The organic insulating layer is exposed and developed through a photolithography process (a third masking process) to expose an upper portion (i.e., a contact region) of the drain electrode 223, and the entirety of the data pad portion and the gate pad portion.

Thereafter, a curing process is performed at a temperature of, for example, about 230° C. to cure the second protective film 215b as an organic insulating layer.

Figure 11C:
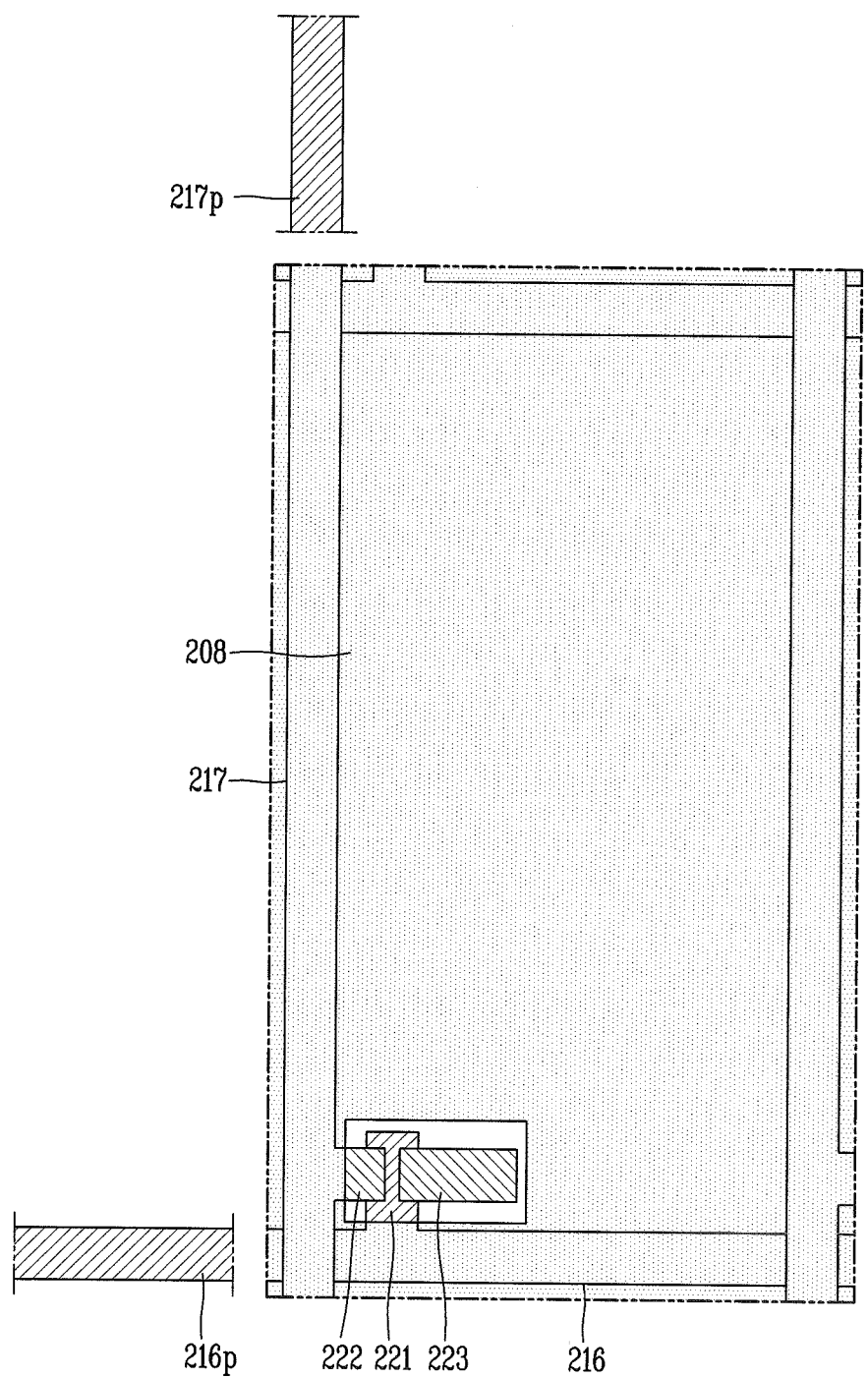
Figure 12D:
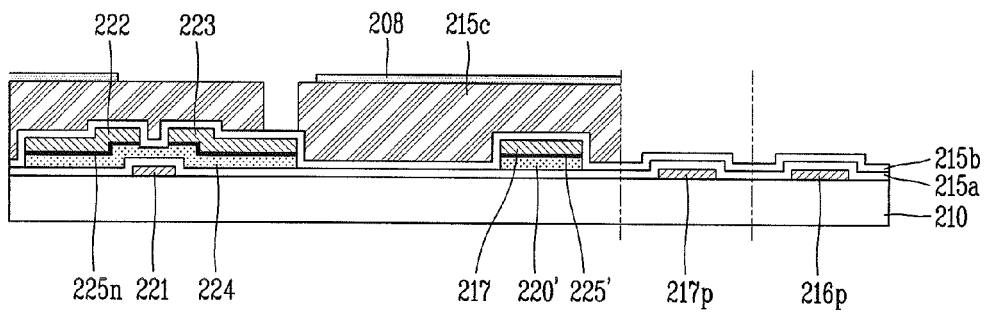

Thereafter, as illustrated in FIGS. 11C and 12D, a third conductive film is formed on the entire surface of the array substrate 210 with the second protective film 215c formed thereon, and then, selectively removed through a photolithography process (a fourth masking process) to form the common electrode formed of the third conductive film in the pixel portion of the array substrate 210.

The third conductive film may be made of a transparent conductive material having a high transmissivity such as indium tin oxide (ITO) or indium zinc oxide (IZO) to form the common electrode 208.

The common electrode 108 may be formed as a single pattern over the entire pixel portion excluding a contact region between the drain electrode 223 and the pixel electrode to allow the drain electrode 223 (to be formed) and the pixel electrode to be connected. However, the present invention is not limited thereto and the common electrode 208 may be formed to have a box-like shape within each pixel region.

Figure 11D:
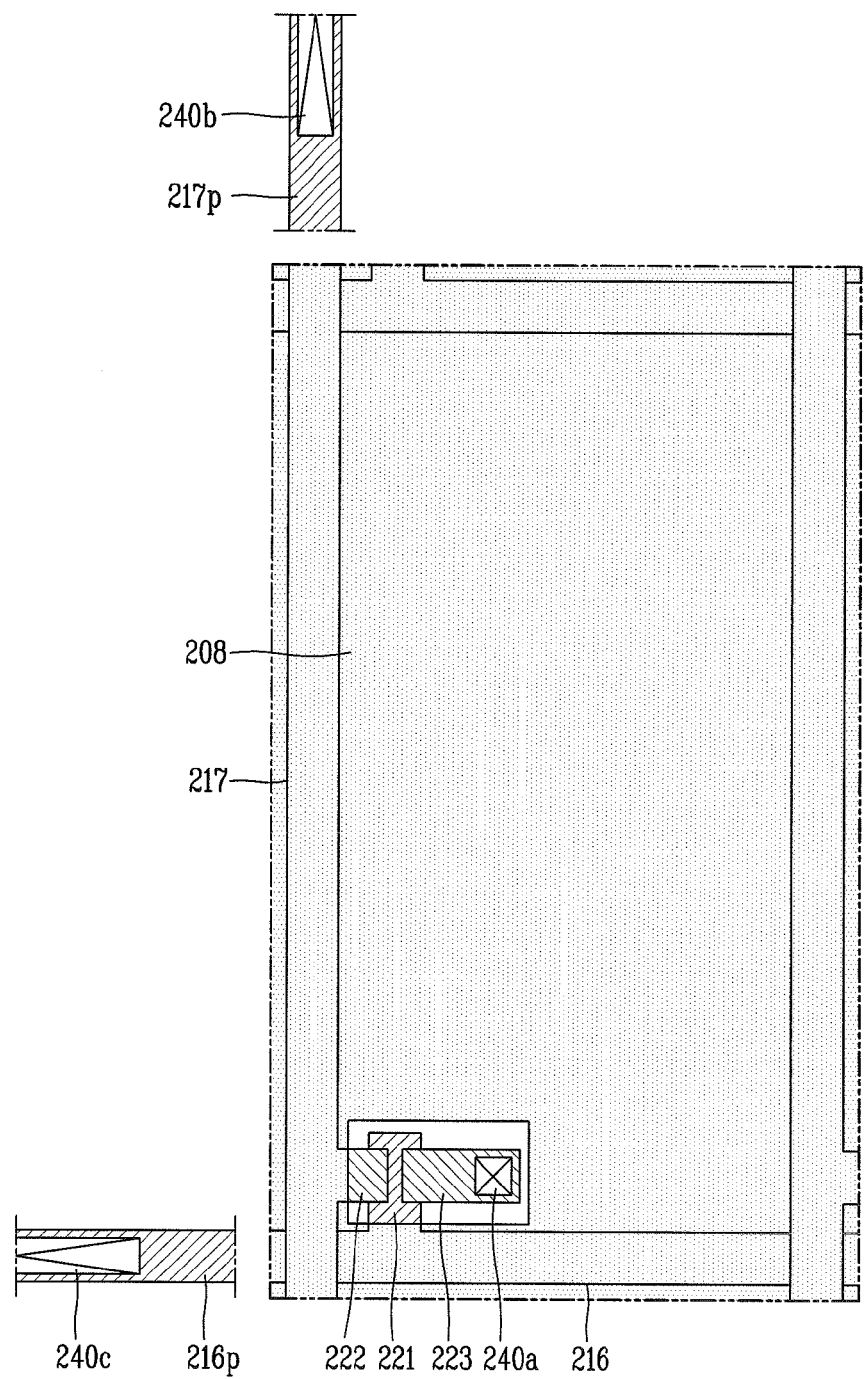
Figure 12E:
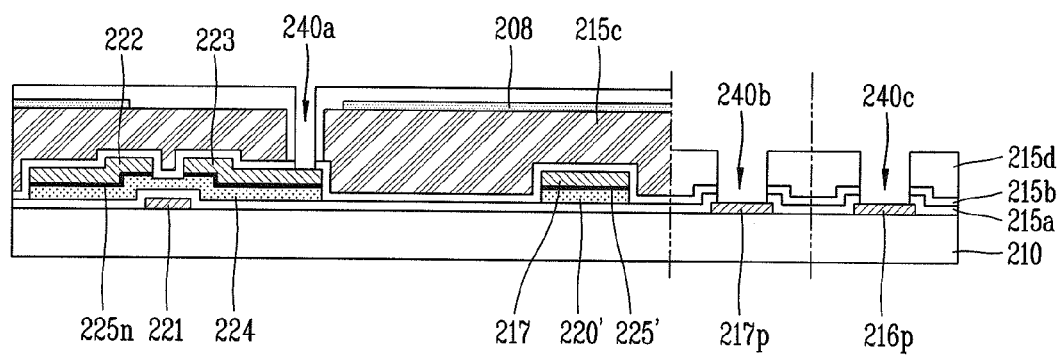

Thereafter, as illustrated in FIGS. 11D and 12E, the third protective film 215d is formed on the entire surface of the array substrate 210 with the common electrode 208 formed thereon.

The third protective film 215d may be formed as an inorganic insulating layer such as a silicon nitride film or a silicon oxide film, and in case that the lower second protective film 215c is formed as an organic insulating layer, the third protective film 215d is formed at a process temperature, e.g., 230° C., lower than that of a preceding process, i.e., a curing process, of the second protective film 215c.

In particular, in the case of the second embodiment of the present invention, the upper layer of the third protective film 215d is deposited to have high porosity relative to the lower layer of the third protective film 215d. For example, the ratio of the NH3 gas to the SiH4 gas may be increased from 1:3 to 1:4, a flow rate of the N2 gas may be reduced from 100% to less than 100%, and a thickness (~200 Å) of the upper layer of the third protective film 215d over the total thickness (~2000 Å) of the third protective layer 215d may range from 5% to 20%.

Namely, when the third protective film 215d is deposited, the upper layer of the third protective film 215d is formed to have porous film quality (more than the lower layer of the third protective film) by reducing the relative Si—N bond of the upper layer of the third protective film 215d, in comparison to the discontinuous deposition surface between the gate insulating layer 215a and the first and third protective films 215b and 215d having vulnerable interface therebetween.

In this case, the upper layer of the third protective film 215d may be formed as a thin film in which a ratio of the Si—H/ Si—H bonding is 80% or more.

Thereafter, the third protective film 215d, the first protective film 215b, and the gate insulating layer 215a are selectively removed through a photolithography process (a fifth masking process) to form the first contact hole 240a exposing a portion of the drain electrode 223 and the second contact hole 240b and the third contact hole 240c exposing portions of the data pad line 217p and the gate pad line 216p in the data pad portion and the gate pad portion of the array substrate 210, respectively.

Here, as mentioned above, in the case of depositing the upper layer of the third protective film 215d to have more porosity than that of the lower layer, although the gate insulating layer 215a, the first protective film 215b, and the third protective film 215d are collectively dry-etched, an etch rate of the upper layer of the third protective film 215d to a discontinuous deposition surface between the gate insulating layer 215a and the first and third protective films 215b and 215d is so high that the pad portion contact holes, i.e., the second contact hole 240b and the third contact hole 240c, tapered in a forward direction can be formed.

Figure 11E:
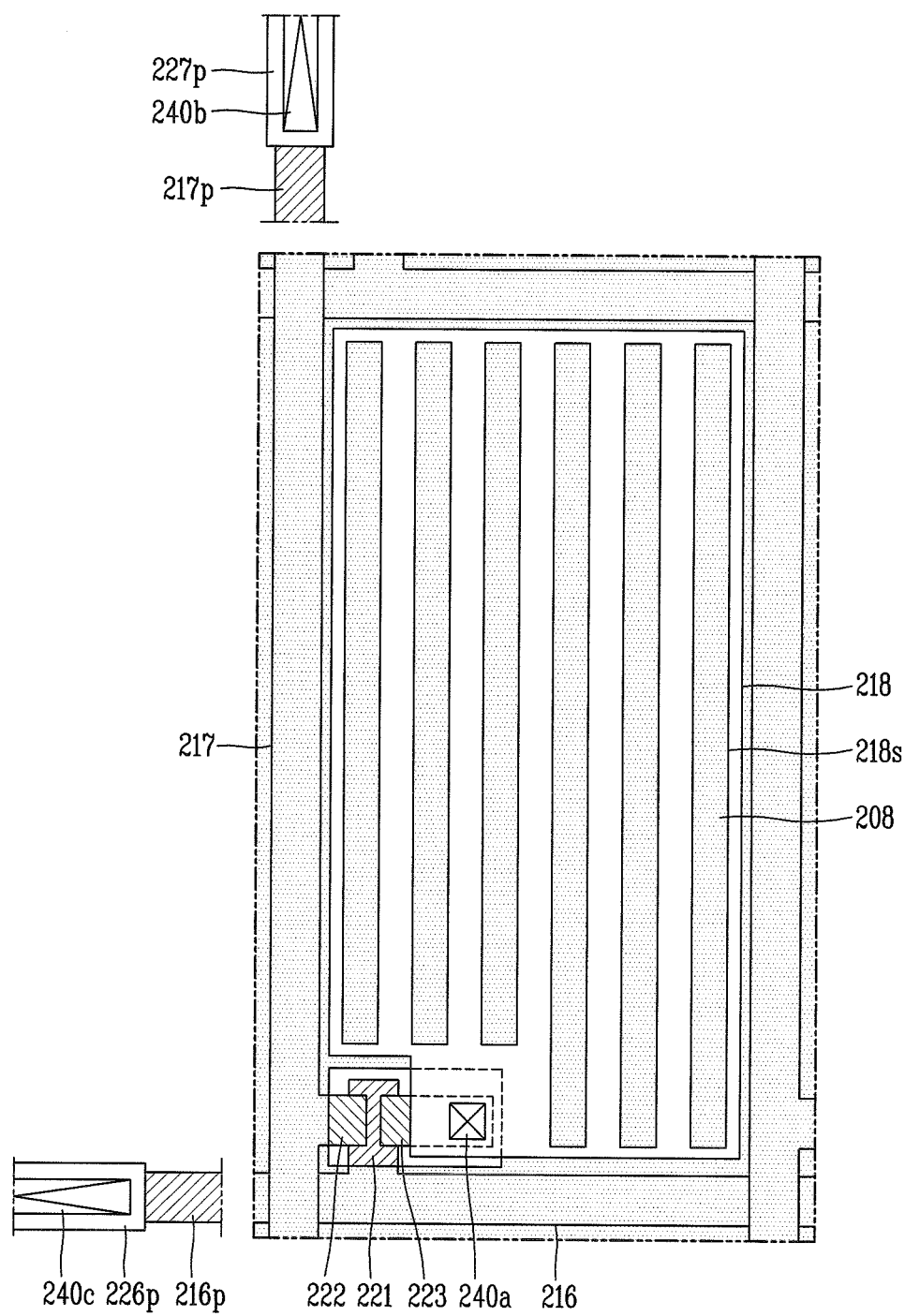
Figure 12F:
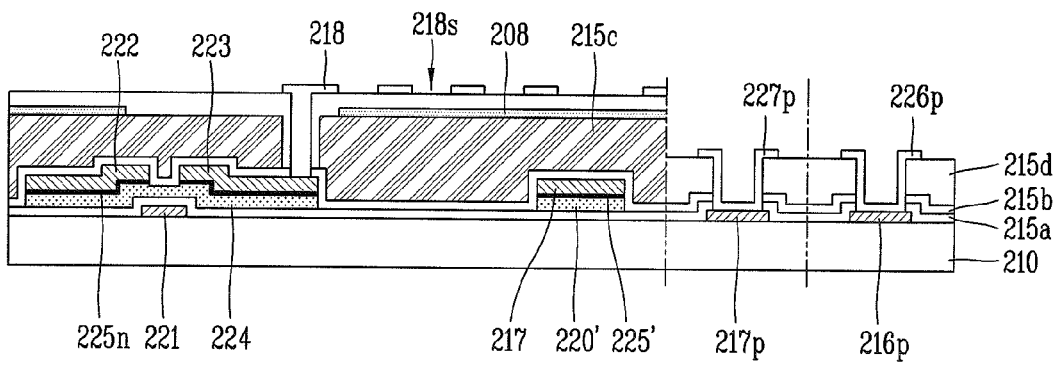

Next, as illustrated in FIGS. 11E and 12F, a fourth conductive film made of a transparent conductive material is formed on the entire surface of the array substrate 210 with the third protective film 215d formed thereon, and selectively patterned by using a photolithography process (a sixth masking process) to form the pixel electrode 218 having a plurality of slits 218s electrically connected to the drain electrode 223 through the first contact hole 240a in the pixel region of the array substrate 110.

Here, the fourth conductive film is selectively patterned by using the sixth masking process to form the data pad electrode 227p and the gate pad electrode 226p electrically connected to the data pad line 217p and the gate pad line 216p through the second contact hole 240b and the third contact hole 240c in the data pad portion and the gate pad portion, respectively.

Meanwhile, in the FFS LCD devices according to the first and second embodiments of the present invention, the case in which the common electrode is formed in a lower portion and the pixel electrode is formed in an upper power is taken as an example, but the present invention is not limited thereto and may also be applicable to a case in which the pixel electrode is formed in a lower portion and the common electrode is formed in an upper portion. This will be described in detail with reference to the accompanying drawings.

Figure 13:
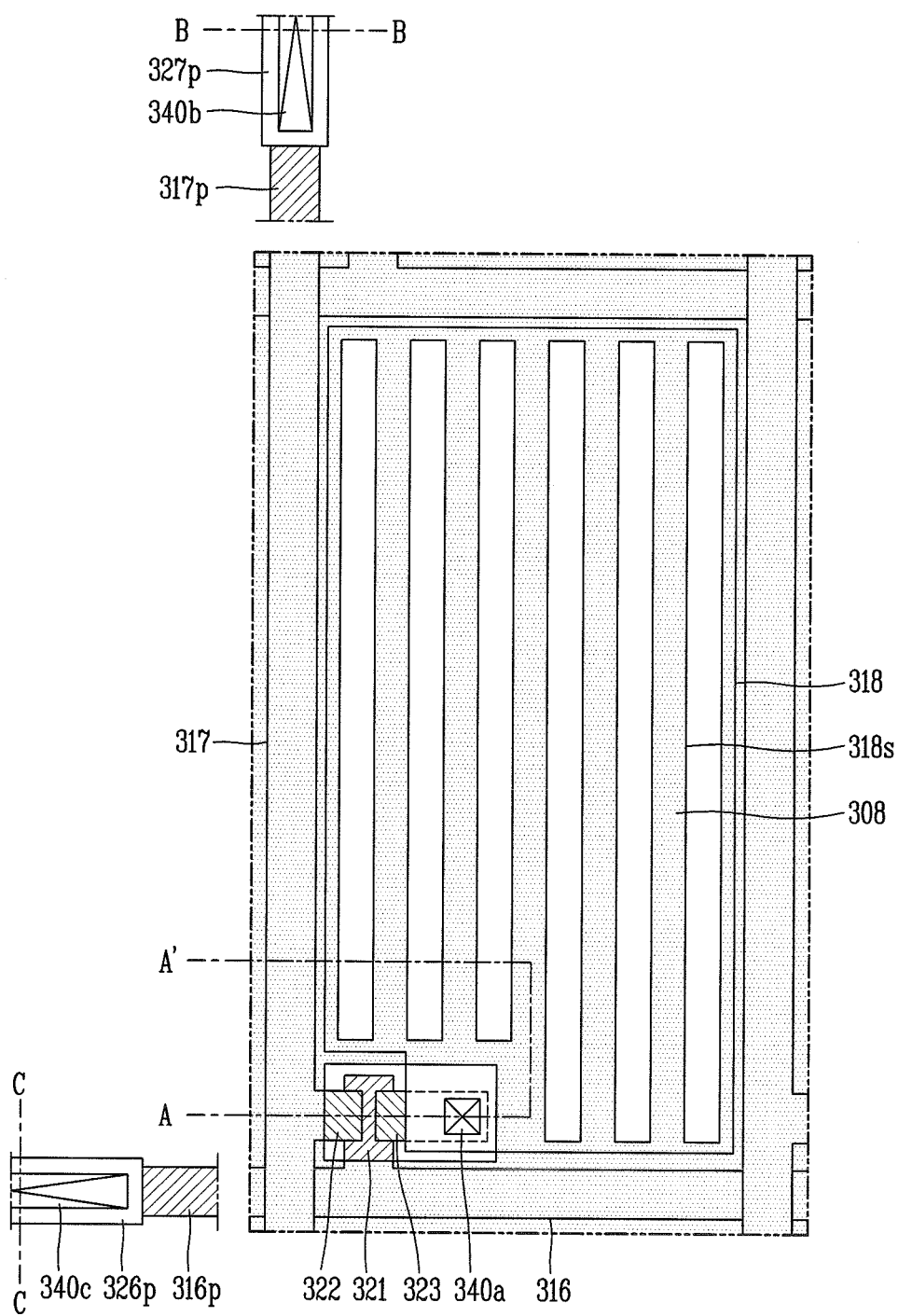
FIG. 13 is a schematic plan view illustrating a portion of an array substrate of an FFS LCD device according to a third embodiment of the present invention.

FIG. 13 is a plan view schematically illustrating a portion of an array substrate of an FFS LCD device according to a third embodiment of the present invention.

Figure 14:
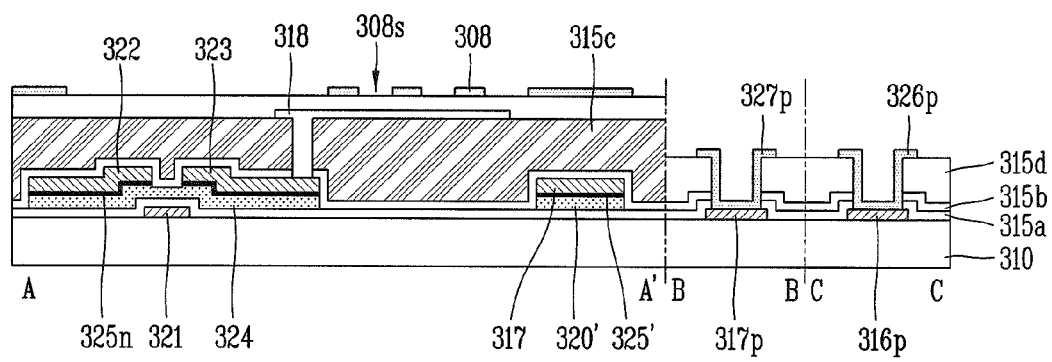
FIG. 14 is a schematic sectional view illustrating a portion of the array substrate of the FFS LCD device according to the third embodiment of the present invention.

FIG. 14 is a sectional view schematically illustrating a portion of the array substrate of the FFS LCD device according to the third embodiment of the present invention, taken along lines A-A', B-B, and C-C of the array substrate illustrated in FIG. 13.

As mentioned above, single pixel including a pixel portion, a data pad portion, and a gate pad portion is illustrated for description purpose. N number of gate lines and M number of data lines intersect so M×N number of pixels exist in an actual LCD device. But for the sake of explanation, a single pixel is illustrated in the drawings.

As illustrated in the drawings, a gate line 316 and a data line 317 are formed to be arranged vertically and horizontally to define a pixel region on the array substrate 310 according to a first embodiment of the present invention. Also, a thin film transistor (TFT), a switching element, is formed at a crossing of the gate line 316 and the data line 317. A pixel electrode 318 and a common electrode 308 having a plurality of slits 308s are formed to generate a fringe field to drive liquid crystal molecules in the pixel region.

The TFT includes a gate electrode 321 connected to the gate line 316, a source electrode 322 connected to the data line 317, and a drain electrode 323 electrically connected to the pixel electrode 318. Further, the TFT includes a gate insulating layer 215a insulating the gate electrode 221 and the source and drain electrodes 222 and 223, and an active layer 224 forming a conductive channel between the source electrode 222 and the drain electrode 223 by a gate voltage supplied to the gate electrode 221.

Here, the source and drain regions of the active layer 324 form ohmic-contact with the source and drain electrodes 322 and 323 through an ohmic-contact layer 325n.

A portion of the source electrode 322 extends in one direction so as to be connected to the data line 317, and a portion of the drain electrode 323 extends toward the pixel region so as to be electrically connected to the pixel electrode 318 through a first contact hole 340a formed in a first protective film 315b and a second protective film 315c.

In the case of the third embodiment, like the second embodiment of the present invention, the active layer 324 and the data wiring (i.e., the source electrode 322), the drain electrode 323, and the data line 317 are simultaneously patterned through the same masking process, whereby one masking process can be reduced. Thus, the active layer 324 and the source and drain electrodes 322 and 323 may be patterned to have substantially the same shape, and an amorphous silicon thin film pattern 320' and an n+ amorphous silicon thin film pattern 325' formed of an amorphous silicon thin film and n+ amorphous silicon thin film are formed under the data line 317, respectively, but the present invention is not limited thereto.

As described above, the common electrode 208 and the pixel electrode 218 are formed to generate a fringe field in the pixel region, and here, the pixel electrode 318 may be formed to have a box-like shape in the pixel region and the common electrode 208 may be formed as a single pattern over the entire pixel portion excluding the TFT region and have a plurality of slits 308s in each pixel region.

Meanwhile, a gate pad electrode 326p and a data pad electrode 327p are formed on edge regions of the array substrate 310 and electrically connected to the gate line 316 and the data line 317. The gate pad electrode 326p and the data pad electrode 327p deliver a scan signal and a data signal received from an external driving circuit unit (not shown) to the gate line 316 and the data line 317, respectively.

Namely, the gate line 316 and the data line 317 extend toward the driving circuit unit so as to be connected to the corresponding gate pad line 316p and data pad line 317p, respectively, and the gate pad line 316p and the data pad line 317p receive a scan signal and a data signal from the driving circuit unit through the gate pad electrode 326p and the data pad electrode 327p electrically connected to the gate pad line 316p and the data pad line 217p, respectively.

The data pad line 317p is electrically connected to the data pad electrode 327p through the second contact hole 340b, and the gate pad line 316p is electrically connected to the gate pad electrode 326p through the third contact hole 340c.

The data pad line 317p according to the third embodiment of the present invention is formed on the same layer on which the gate pad line 216 is formed 216p, through the same masking process, but the present invention is not limited thereto.

In the FFS LCD device according to the third embodiment of the present invention configured as described above, when an organic insulating layer such as photoacryl is used as the second protective film 315c in order to implement low power consumption, the upper third protective film 315d is formed at a process temperature, e.g., at 230, lower than that of the preceding process, namely, the photoacryl curing process.

In this case, in the related art, when a pad portion contact hole is formed, an undercut is formed within the pad portion contact hole, but in the case of the third embodiment of the present invention, like the second embodiment of the present invention as described above, film quality of an upper layer of the third protective film 315d is changed to increase an etch rate of the upper layer of the third protective film 315d to a discontinuous deposition surface between the gate insulating layer 315a and the first and third protective films 315b and 315d, thus improving undercut within the pad portion contact holes 340b and 340c without performing an additional masking process.

Hereinafter, a method for fabricating an FFS LCD device according to the third embodiment of the present invention will be described in detail with reference to the accompanying drawings.

FIGS. 15A to 15F are plan views sequentially illustrating a process of fabricating the array substrate illustrated in FIG. 13.

FIGS. 16A to 16F are sectional views sequentially illustrating a process of fabricating the array substrate illustrated in FIG. 14, in which the left side shows a process of fabricating the array substrate of the pixel portion, and the right side shows a process of fabricating an array substrate of the data pad portion and the gate pad portion sequentially.

Figure 15A:
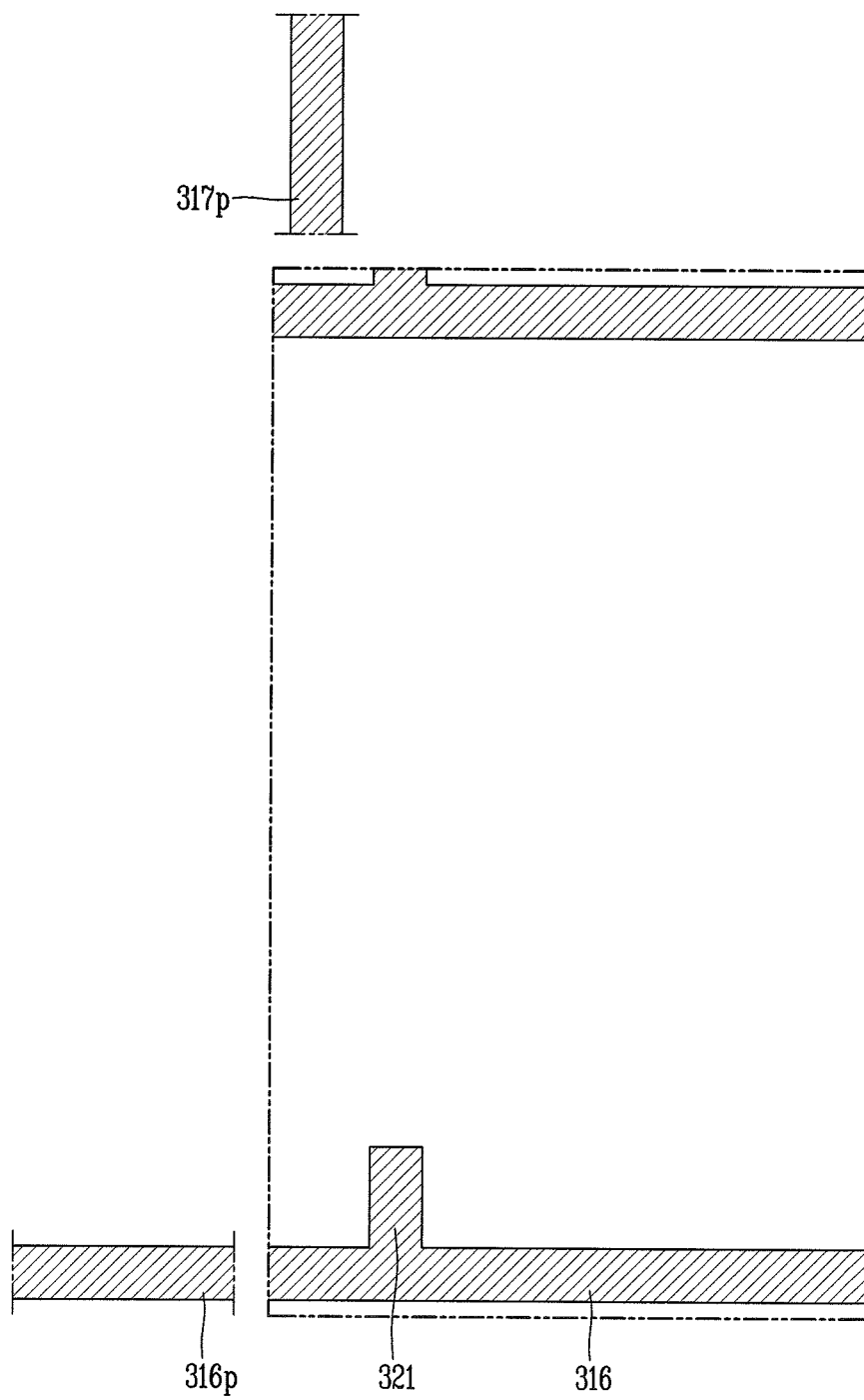
FIGS. 15A to 15F are plan views illustrating a sequence of a process of fabricating the array substrate illustrated in FIG. 13.
Figure 16A:
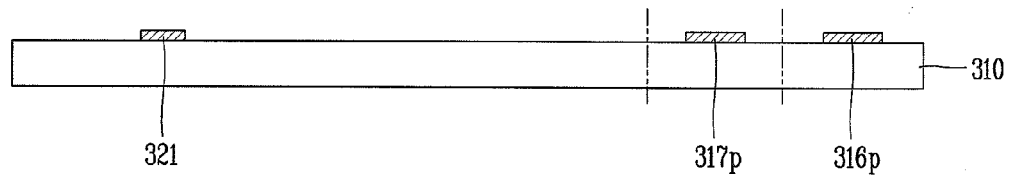
FIGS. 16A to 16F are sectional views illustrating a sequence of a process of fabricating the array substrate illustrated in FIG. 14.

As illustrated in FIGS. 15A and 16A, the gate electrode 321 and the gate line 316 made of a transparent insulating material such as glass are formed in the pixel portion of the array substrate 310, and the gate pad line 316p and the data pad lines 317p are formed in the gate pad portion and the data pad portion of the array substrate 110, respectively. However, the present invention is not limited thereto, and the data pad line 317p may be formed through a different masking process from that of the gate electrode 321, the gate line 316, and the gate pad line 316p.

The gate electrode 321, the gate line 316, the gate pad line 316p, and the data pad line 317p are formed by depositing a first conductive film on the entire surface of the array substrate 110 and subsequently selectively patterning the first conductive film through a photolithograph process (a first masking process).

The first conductive film may be made of a low-resistivity opaque conductive material such as aluminum (Al), an Al alloy, tungsten (W), copper (Cu), chromium (Cr), molybdenum (Mo), a Mo alloy, and the like. Also, the first conductive film may have a multilayered structure by stacking two or more types of low-resistivity conductive materials.

Figure 15B:
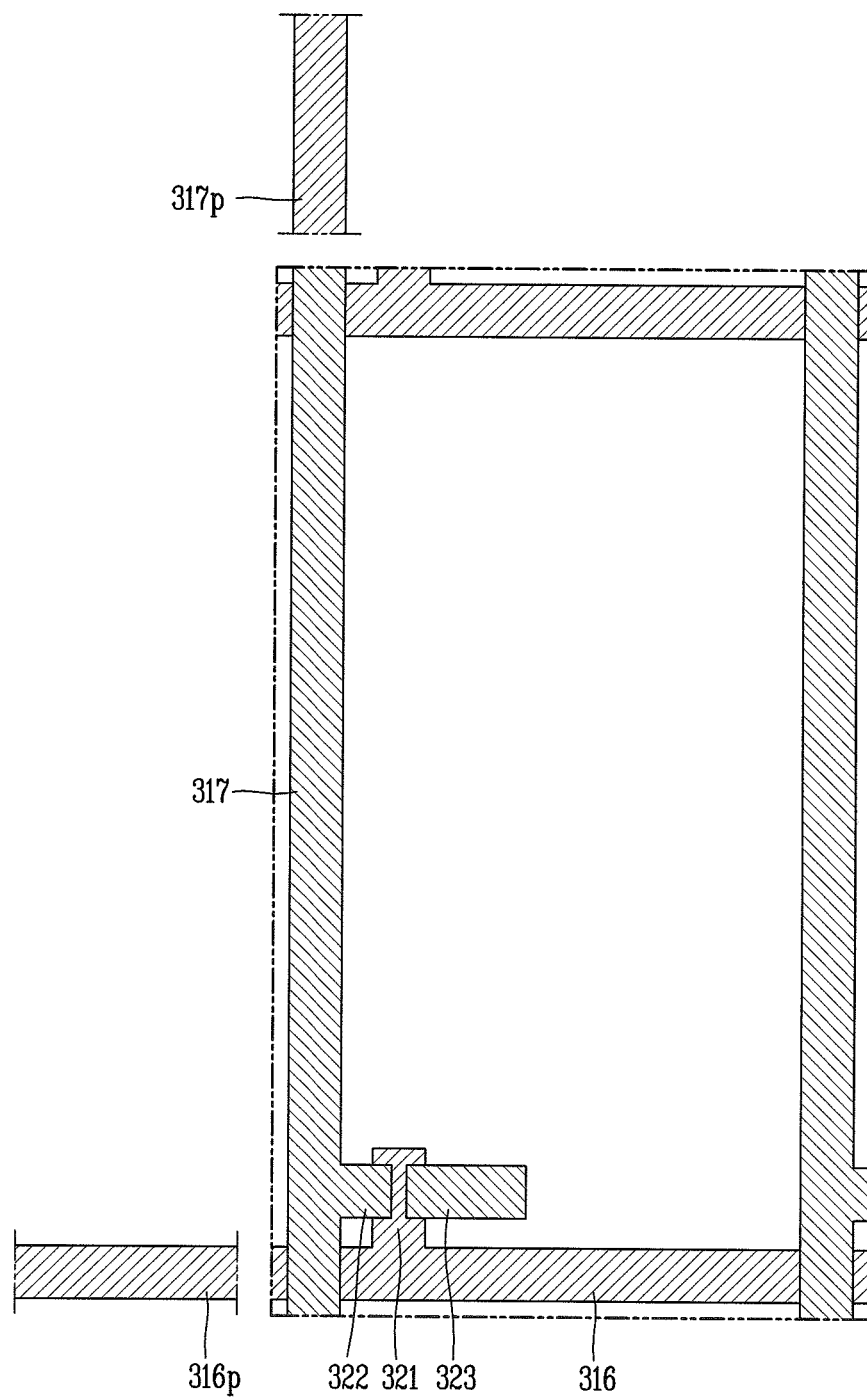
Figure 16B:
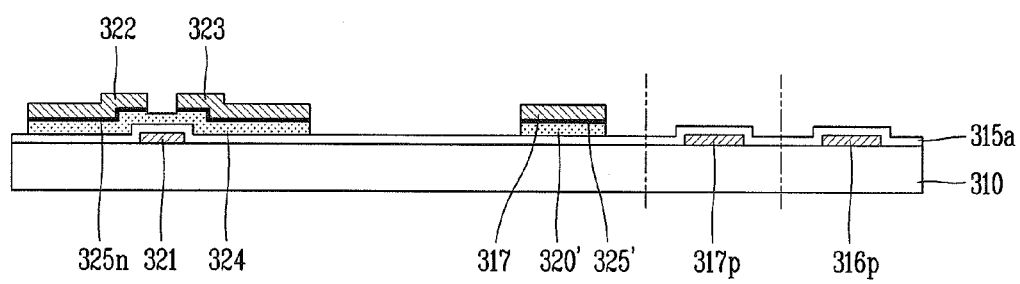

Next, as shown in FIGS. 15B and 16B, the gate insulating layer 315a, an amorphous silicon thin film, an n+ amorphous silicon thin film, and a second conductive film are formed on the entire surface of the array substrate 310 with the gate electrode 321, the gate line 316, the gate pad line 316p, and the data pad line 317p formed thereon.

In order to form a source electrode, a drain electrode, and a data line, the second conductive film may be made of a low-resistivity opaque conductive material such as aluminum (Al), an Al alloy, tungsten (W), copper (Cu), chromium (Cr), molybdenum (Mo), a Mo alloy, and the like. Also, the second conductive film may have a multilayered structure by stacking two or more types of low-resistivity conductive materials.

Thereafter, the amorphous silicon thin film, the n+ amorphous silicon thin film, and the second conductive film are selectively removed through a photolithography process (a second masking process) to form the active layer 324 formed of the amorphous silicon thin film in the pixel portion of the array substrate 310 and the source electrode 322 and the drain electrode 323 formed of the second conductive film on an upper portion of the active layer 324.

The data line 317 formed of the second conductive film is formed in the data line region of the array substrate 310 through the second masking process.

The ohmic-contact layer 325n formed of the n+ amorphous silicon thin film and allowing the source and drain regions of the active layer 324 and the source and drain electrodes 322 and 323 to be in ohmic-contact with each other is formed on an upper portion of the active layer 324. Also, the active layer 324 and the source and drain electrodes 322 and 323 are patterned to have the substantially same shape, and an amorphous silicon thin film pattern 320' and an n+ amorphous silicon thin film pattern 325' formed of the amorphous silicon thin film and the n+ amorphous silicon thin film are formed under the data line 317.

In the case of the third embodiment, since the active layer 324, the data wiring, namely, the source electrode 322, the drain electrode 323, and the data line 317, is simultaneously patterned through the same masking process, whereby one masking process can be reduced. However, the present invention is not limited thereto and the active layer 324 and the data wiring may be separately formed through masking process two times.

Figure 15C:
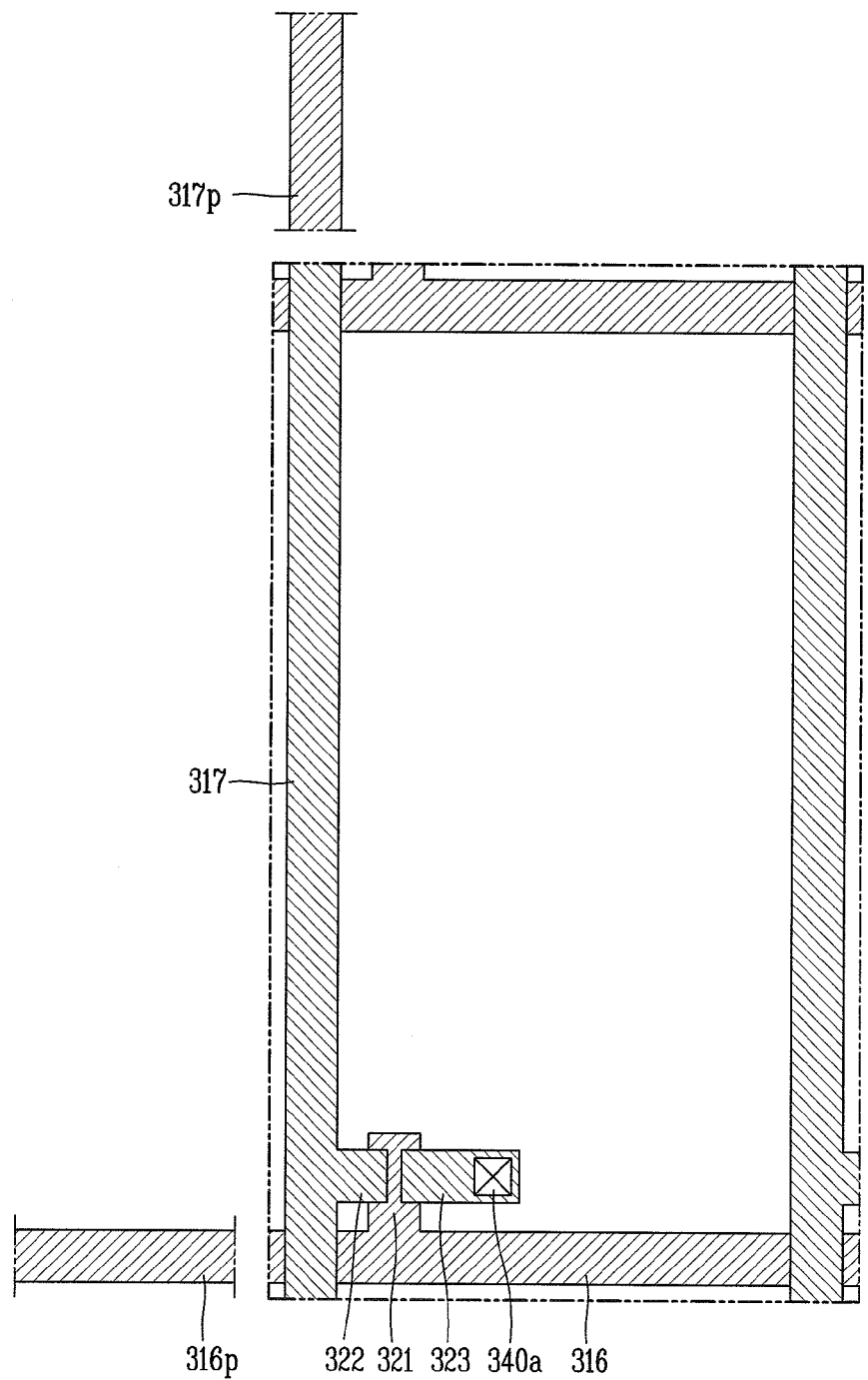
Figure 16C:
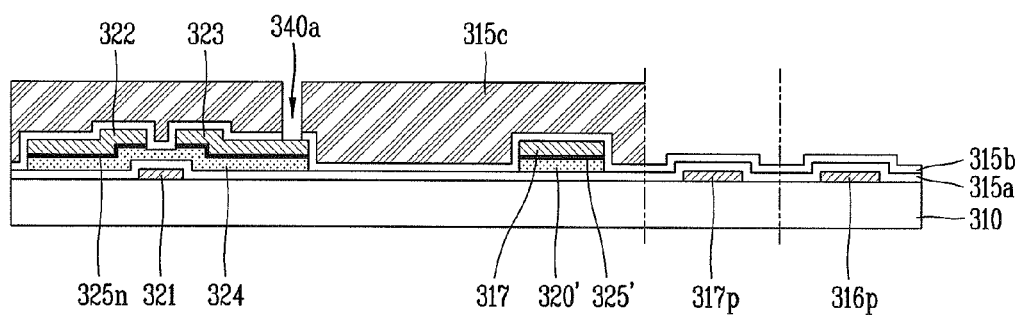

Thereafter, as illustrated in FIGS. 15C and 16C, the first protective film 315b and the second protective film 315c are formed on the entire surface of the array substrate 310 with the active layer 324, the source and drain electrodes 322 and 323, and the data line 317 formed thereon.

The first protective film 315b may be formed as an inorganic film such as a silicon nitride film or a silicon oxide film, and the second protective film 315c may be formed as an organic insulating layer such as photoacryl including a component such as acrylate, polyimide, epoxy, or the like.

The organic insulating layer is exposed and developed through a photolithography process (a third masking process) to expose an upper portion, i.e., a contact region, of the drain electrode 223, and the entirety of the data pad portion and the gate pad portion.

Thereafter, a curing process is performed at a temperature of, for example, about 230 to cure the second protective film 215b as an organic insulating layer, and thereafter, the first protective film 315b of the pixel portion is selectively removed to form the first contact hole 340a exposing a portion of the drain electrode 323.

Figure 15D:
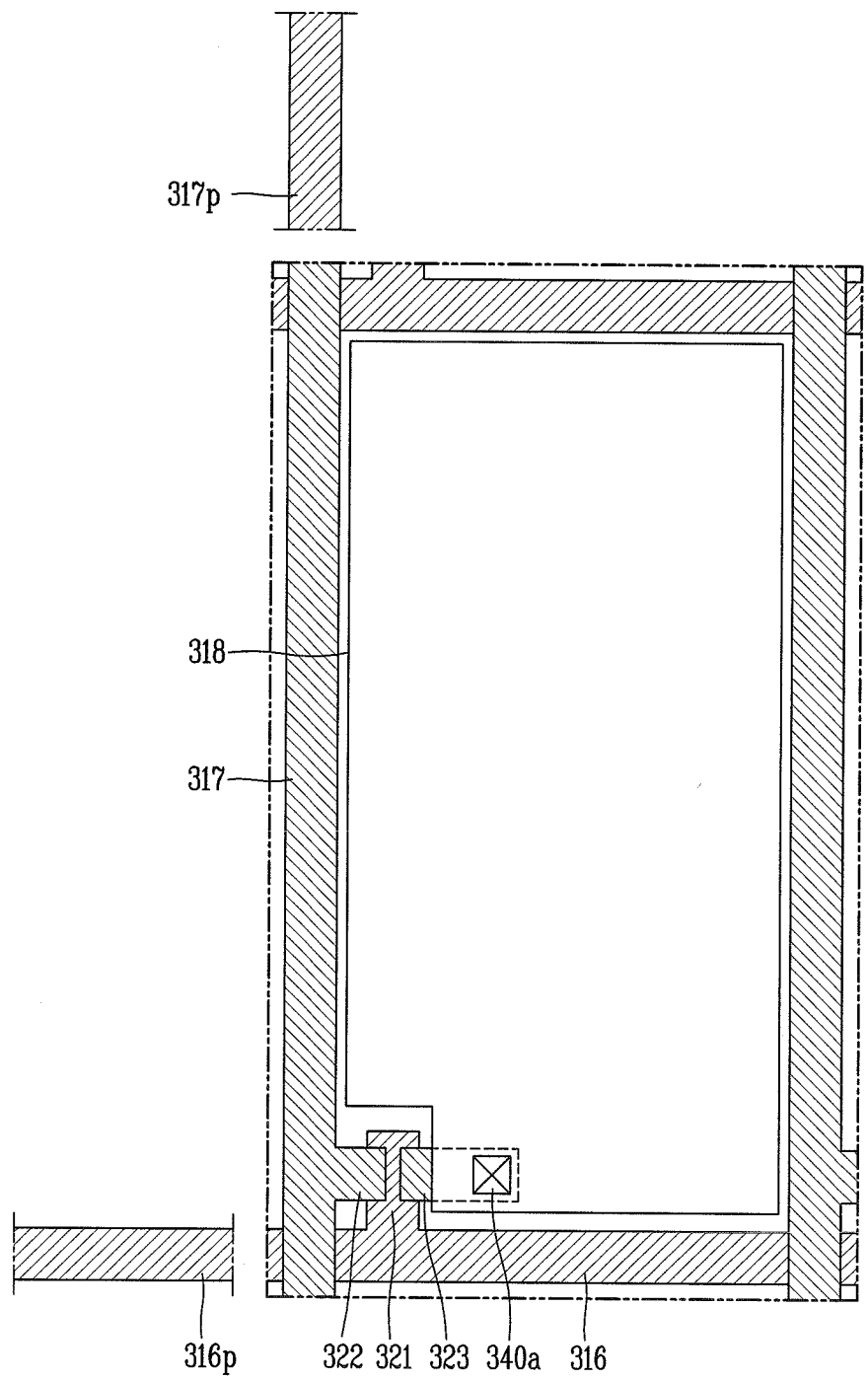
Figure 16D:
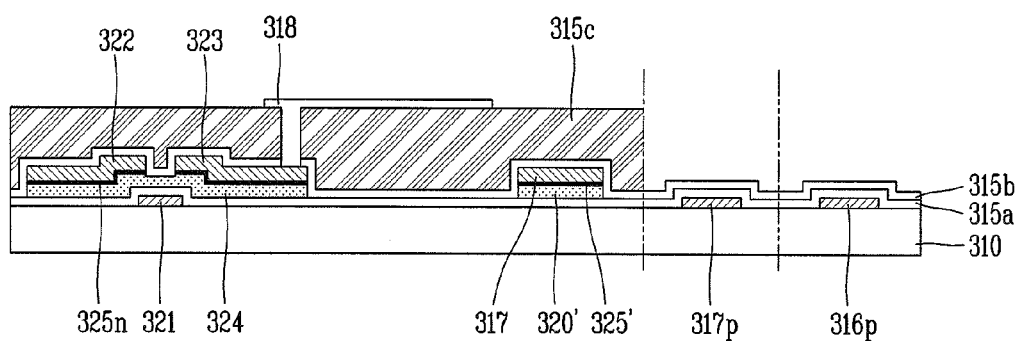

Thereafter, as illustrated in FIGS. 15D and 16D, a third conductive film is formed on the entire surface of the array substrate 310 with the second protective film 315c formed thereon, and then, selectively removed through a photolithography process (a fourth masking process) to form the pixel electrode 318 having a box-like shape and electrically connected to the drain electrode 323 through the first contact hole 340a.

The third conductive film may be made of a transparent conductive material having a high transmissivity such as indium tin oxide (ITO) or indium zinc oxide (IZO) to form the pixel electrode 318.

Figure 15E:
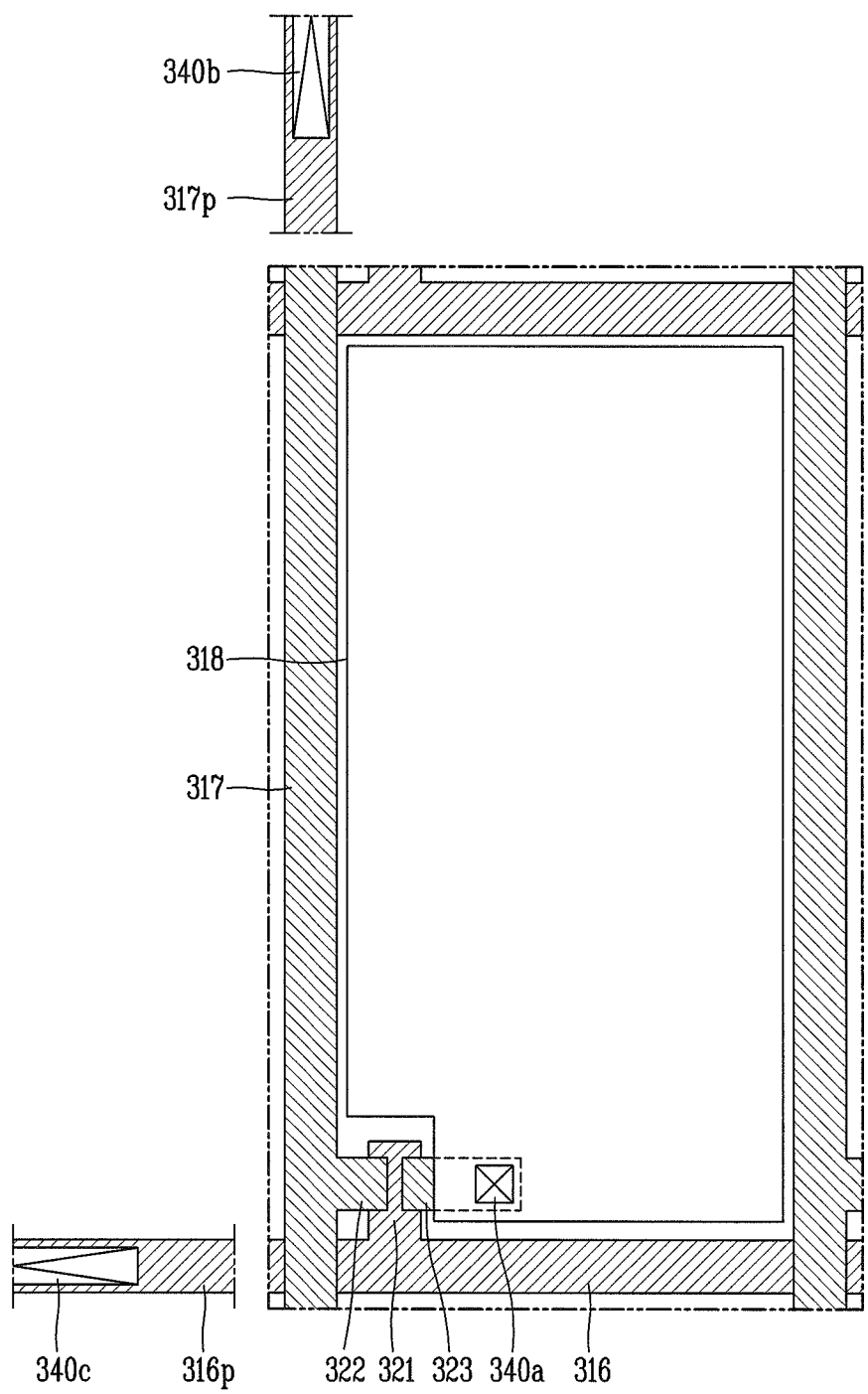
Figure 16E:
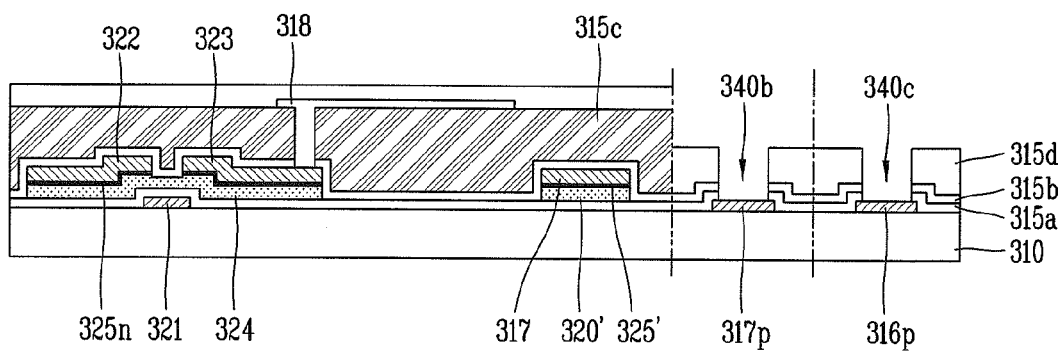

Thereafter, as illustrated in FIGS. 15E and 16E, the third protective film 315d is formed on the entire surface of the array substrate 310 with the pixel electrode 318 formed thereon.

The third protective film 315d may be formed as an inorganic insulating layer such as a silicon nitride film or a silicon oxide film, and in case that the lower second protective film 315c is formed as an organic insulating layer, the third protective film 315d is formed at a process temperature, e.g., 230° C., lower than that of a preceding process, i.e., a curing process, of the second protective film 315c.

In particular, in the case of the third embodiment of the present invention, like the second embodiment of the present invention as described above, the upper layer of the third protective film 315d is deposited to have high porosity relative to the lower layer of the third protective film 315d. For example, the ratio of the $NH_3$ gas to the $SiH_4$ gas may be increased from 1:3 to 1:4, a flow rate of the $N_2$ gas may be reduced from 100% to less than 100%, and a thickness (~200 Å) of the upper layer of the third protective film 315d over the total thickness (~2000 Å) of the third protective layer 315d may range from 5% to 20%.

Namely, when the third protective film 315d is deposited, the upper layer of the third protective film 315d is formed to have porous film quality (more than the lower layer of the third protective film) by reducing the relative Si—N bond of the upper layer of the third protective film 315d, in comparison to the discontinuous deposition surface between the gate insulating layer 315a and the first and third protective films 315b and 315d having vulnerable interface therebetween.

In this case, the upper layer of the third protective film 315d may be formed as a thin film in which a ratio of the Si—H/Si—H bonding is 80% or more.

Thereafter, the third protective film 315d, the first protective film 315b, and the gate insulating layer 315a are selectively removed through a photolithography process (a fifth masking process) to form the second contact hole 340b and the third contact hole 340c exposing portions of the data pad line 317p and the gate pad line 316p in the data pad portion and the gate pad portion of the array substrate 210, respectively.

As mentioned above, in the case of depositing the upper layer of the third protective film 315d to have more porosity than that of the lower layer, although the gate insulating layer 315a, the first protective film 315b, and the third protective film 315d are collectively dry-etched, an etch rate of the upper layer of the third protective film 315d to a discontinuous deposition surface between the gate insulating layer 315a and the first and third protective films 315b and 315d is so high that the pad portion contact holes, i.e., the second contact hole 340b and the third contact hole 340c, tapered in a forward direction can be formed.

Figure 15F:
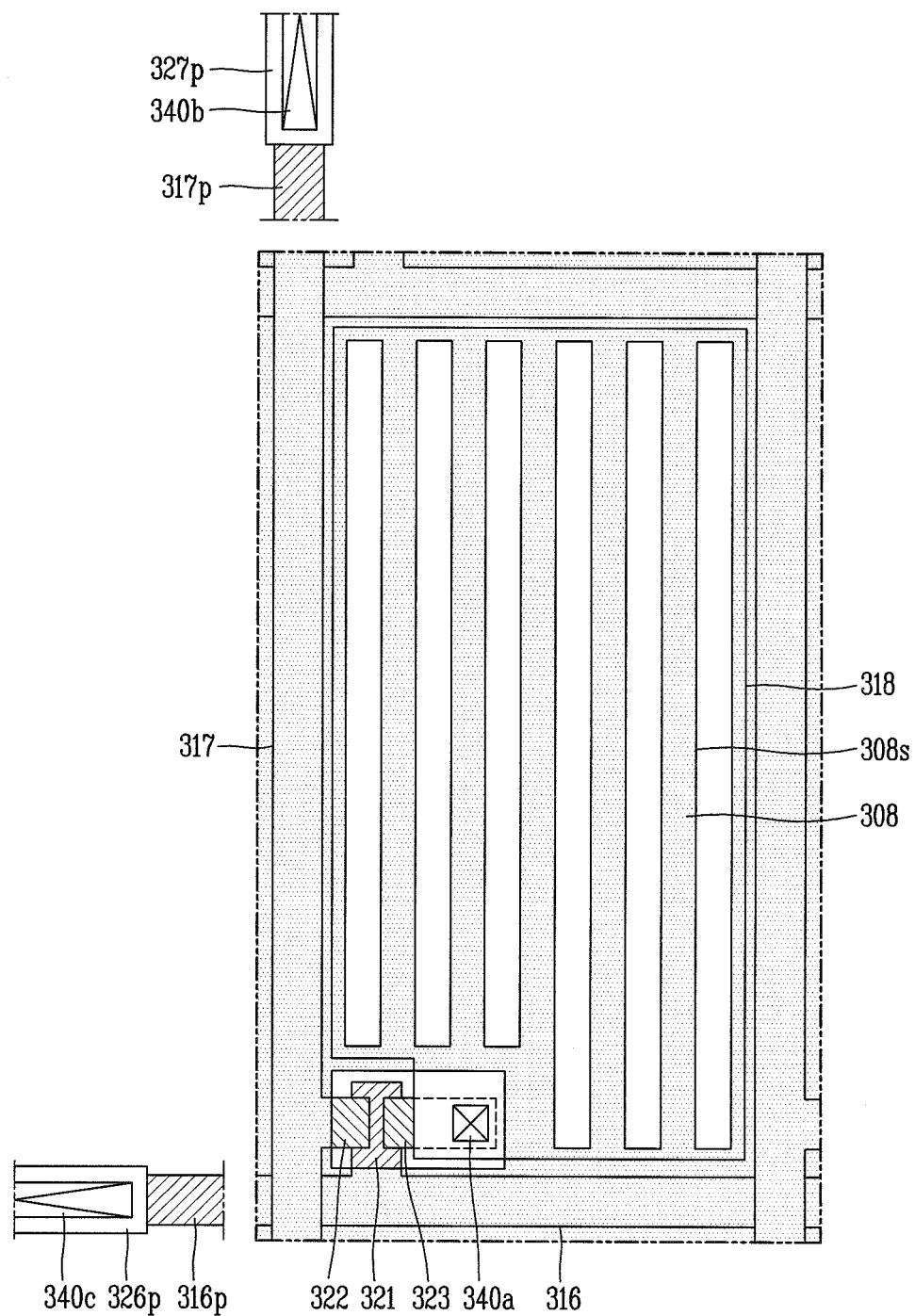
Figure 16F:
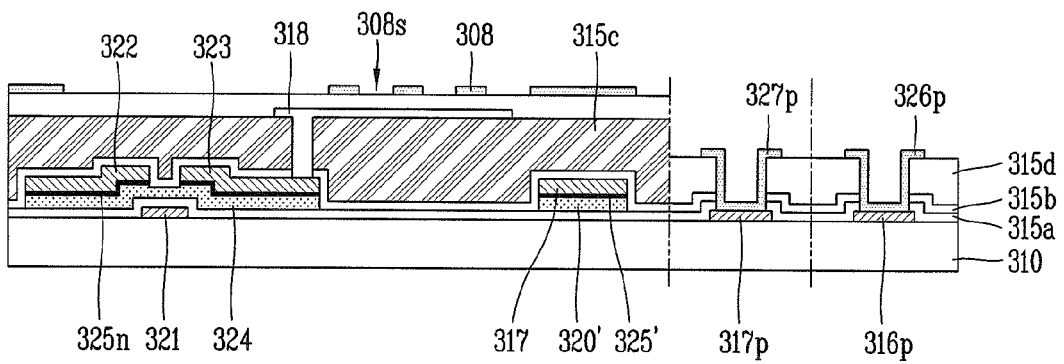

Next, as illustrated in FIGS. 15F and 16F, a fourth conductive film made of a transparent conductive material is formed on the entire surface of the array substrate 310 with the third protective film 315d formed thereon, and selectively patterned by using a photolithography process (a sixth masking process) to form the common electrode 308 formed of the fourth conductive film and having a plurality of slits 308s in the pixel portion of the array substrate 310.

Here, the fourth conductive film may be made of a transparent conductive material having a high transmissivity such as indium tin oxide (ITO) or indium zinc oxide (IZO) to form the common electrode 308.

The common electrode 308 may be formed as a single pattern over the entire pixel portion excluding the TFT region. However, the present invention is not limited thereto and the common electrode 308 may be formed to have a box-like shape with the plurality of slits 308s.

Here, by selectively patterning the fourth conductive film through the sixth masking process, the data pad electrode 327p and the gate pad electrode 326p electrically connected to the data pad line 317p and the gate pad line 316p through the second contact hole 340b and the third contact hole 340c are formed in the data pad portion and the gate pad portion, respectively.

The array substrates according to the first to third embodiments of the present invention are attached with color filter substrates in a facing manner by means of a sealant applied to outer edges of an image display region. In this case, color filters for implementing red, green and blue colors are formed on the color filter substrates.

The attachment of the color filter substrates and the array substrates are made through align keys formed on the color filter substrates or the array substrates.

In the FFS LCD devices according to the first to third embodiments of the present invention, the amorphous silicon TFT using an amorphous silicon thin film as an active layer is taken as an example, but the present invention is not limited thereto and the present invention may also be applied to a polycrystalline silicon TFT using a polycrystalline silicon thin film as an active layer and an oxide TFT using an oxide.

The present invention can be also applied to a different display device fabricated by using TFTs, for example, an OLED (Organic Light Emitting Diode) display device in which OLEDs are connected with driving transistors, as well as to the LCD device.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method for fabricating a fringe field switching (FFS) liquid crystal display (LCD) device, the method comprising:
providing a first substrate divided into a pixel portion and a pad portion;
forming a gate electrode and a gate line in the pixel portion of the first substrate and forming a pad line in the pad portion of the first substrate;
forming a gate insulating layer on the first substrate with the gate electrode, the gate line, and the pad line formed thereon;
forming an active layer in an upper portion of the gate electrode with the gate insulating layer formed thereon;
forming a source electrode and a drain electrode in an upper portion of the active layer of the first substrate with the active layer formed thereon, and forming a data line intersecting with the gate line to define a pixel region;

forming a first protective film on the first substrate with the source electrode, the drain electrode, and the data line formed thereon;

forming a second protective film formed as an organic insulating layer in the pixel portion of the first substrate with the protective film formed thereon;

forming a first electrode in the pixel portion of the first substrate with the second protective film formed thereon;

forming a third protective film on the first substrate with the first electrode formed thereon such that an upper layer thereof has higher porosity than that of a lower layer thereof by adjusting a gas flow rate;

selectively etching the gate insulating layer, the first protective film, and the third protective film to form a pad portion contact hole exposing the pad line;

forming a second electrode in the pixel portion of the first substrate with the third protective film formed thereon and forming a pad electrode electrically connected to the pad line through the pad portion contact hole in the pad portion of the first substrate; and attaching the first and second substrates.

2. The method of claim 1, wherein the second protective film is formed as an organic insulating layer.

3. The method of claim 2, wherein the organic insulating layer comprises photoacryl, acrylate, polyimide, or epoxy.

4. The method of claim 2, wherein after the second protective film in the pixel portion of the first substrate, the second protective film is cured through a curing process.

5. The method of claim 4, wherein the third protective film is formed of an inorganic insulating layer at a process temperature lower than that of the curing process.

6. The method of claim 5, wherein the third protective film is formed by increasing a ratio of $NH_3$ gas to $SiH_4$ gas from 1:3 to 1:4 and reducing a flow rate of $N_2$ gas from 100% to less than 100%.

7. The method of claim 5, wherein the upper layer of the third protective film is formed such that a ratio of Si—H/Si—N bonding is 80% or greater in order to reduce a relative Si—N bond of the upper layer of the third protective film in comparison to a discontinuous deposition surface between the gate insulating layer and the first and third protective films.

8. The method of claim 5, wherein the third protective film is formed such that a thickness of the upper layer thereof to a total thickness is 5% to 20%.

9. The method of claim 1, wherein the second electrode is formed as a pixel electrode to have a box-like shape with a plurality of slits in each pixel region, and the first electrode is formed as a common electrode in a single pattern in the entire pixel portion excluding a contact region between the drain electrode and the pixel electrode.

10. The method of claim 1, wherein the first electrode is formed as a pixel electrode to have a box-like shape in each pixel region, and the second electrode is formed as a common electrode in a single pattern in the entire pixel portion excluding the contact region between the drain electrode and the pixel electrode.

11. The method of claim 1, wherein the pad portion contact hole exposing the pad line is formed by selectively etching the gate insulating layer, the first protective film, and the third protective film through a single step or two step dry etching process.

12. The method of claim 1, wherein the pad portion includes a data pad portion and a gate pad portion, and the pad line includes a data pad line and a gate pad line.

13. The method of claim 12, wherein the pad portion contact hole includes a data pad portion contact hole and a gate pad portion contact hole exposing the data pad line and the gate pad line.

14. The method of claim 1, wherein the pad electrode includes a data pad electrode and a gate pad electrode electrically connected to the data pad line and the gate pad line through the data pad portion contact hole and the gate pad portion contact hole, respectively.

* * * * *